(12) United States Patent
Yoshida et al.

(10) Patent No.: US 8,129,628 B2
(45) Date of Patent: Mar. 6, 2012

(54) MULTILAYER WIRING BOARD AND METHOD FOR MANUFACTURING MULTILAYER WIRING BOARD

(75) Inventors: Tokuo Yoshida, Tenri (JP); Akiyoshi Fujii, Nara (JP); Tatsuya Fujita, Suzuka (JP)

(73) Assignee: Sharp Kabushiki Kaisha, Osaka (JP)

( * ) Notice: Subject to any disclaimer, the term of this patent is extended or adjusted under 35 U.S.C. 154(b) by 1022 days.

(21) Appl. No.: 12/067,408

(22) PCT Filed: Aug. 14, 2006

(86) PCT No.: PCT/JP2006/316025
§ 371 (c)(1),
(2), (4) Date: Mar. 19, 2008

(87) PCT Pub. No.: WO2007/052396
PCT Pub. Date: May 10, 2007

(65) Prior Publication Data
US 2010/0071951 A1     Mar. 25, 2010

(30) Foreign Application Priority Data
Oct. 31, 2005   (JP) .................. 2005-317551

(51) Int. Cl.
*H05K 1/11*         (2006.01)

(52) U.S. Cl. ........... 174/262; 427/97.1; 29/846; 29/831; 29/852

(58) Field of Classification Search ................ 174/262; 427/97.1–97.2; 29/846, 831, 852
See application file for complete search history.

(56) References Cited

U.S. PATENT DOCUMENTS

| | | | |
|---|---|---|---|
| 6,534,723 B1 | 3/2003 | Asai et al. | |
| 6,589,594 B1 * | 7/2003 | Hembree | 438/106 |
| 6,713,685 B1 | 3/2004 | Cotton | |
| 7,438,945 B2 * | 10/2008 | Muramatsu et al. | 427/97.7 |
| 7,799,407 B2 * | 9/2010 | Moriya et al. | 428/195.1 |
| 2002/0130739 A1 | 9/2002 | Cotton | |
| 2003/0059984 A1 * | 3/2003 | Sirringhaus et al. | 438/141 |
| 2004/0112617 A1 | 6/2004 | Cotton | |
| 2004/0145858 A1 * | 7/2004 | Sakurada | 361/600 |
| 2004/0201048 A1 * | 10/2004 | Seki et al. | 257/294 |
| 2004/0239730 A1 | 12/2004 | Kurosawa | |
| 2005/0022374 A1 * | 2/2005 | Hirai et al. | 29/825 |
| 2005/0245079 A1 * | 11/2005 | Honda et al. | 438/676 |

FOREIGN PATENT DOCUMENTS

| | | |
|---|---|---|
| JP | 58-176949 A | 10/1983 |
| JP | 2001-7530 A | 1/2001 |
| JP | 2001-217356 A | 8/2001 |
| JP | 2002-525854 A | 8/2002 |
| JP | 2004-304129 A | 10/2004 |

* cited by examiner

*Primary Examiner* — Hung S Bui
*Assistant Examiner* — James Wu
(74) *Attorney, Agent, or Firm* — Birch, Stewart, Kolasch & Birch, LLP

(57) ABSTRACT

The multilayer wiring board is provided with a lower layer wiring (8), and an upper layer wiring (10) formed on the lower layer wiring (8) through an interlayer insulating layer (9). On the interlayer insulating layer (9), a contact hole (11) is provided for interconnecting the upper layer wiring (8) with the lower layer wiring (10). A region surrounded by an inner wall (13) which forms the contact hole (11) is permitted to have a linewidth region wherein a wide line region (13A) and protruding regions (13B, 13C) as regions having different linewidths are connected. Thus, film thickness distribution of an ink baked product (12) formed at the contact hole (11) rises at the protruding regions (13B, 13C), and highly reliable multilayer interconnection can be performed between the lower layer wiring (8) and the upper layer wiring (10).

9 Claims, 12 Drawing Sheets

LINEWIDTH OF THE CONSTRICTED SECTION (REGION 6) (μm)

FIG. 17 (a) PRIOR ART
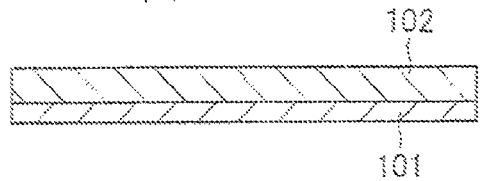
FIG. 17 (b) PRIOR ART
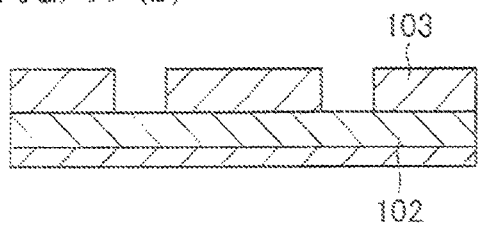
FIG. 17 (c) PRIOR ART
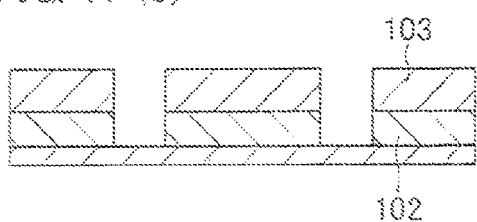
FIG. 17 (d) PRIOR ART
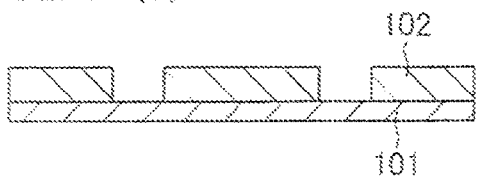
FIG. 17 (e) PRIOR ART
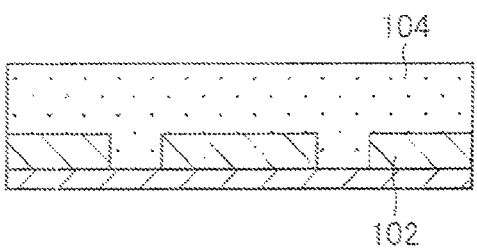
FIG. 17 (f) PRIOR ART
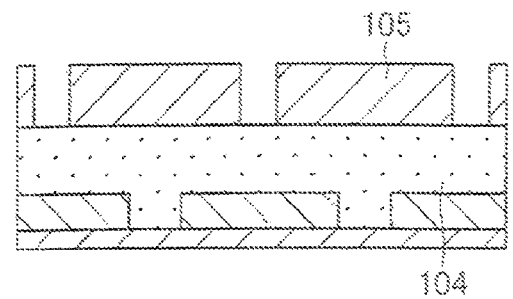
FIG. 17 (g) PRIOR ART
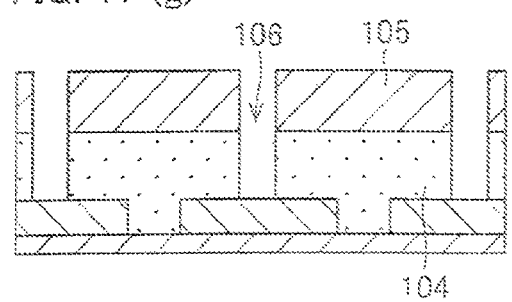
FIG. 17 (h) PRIOR ART
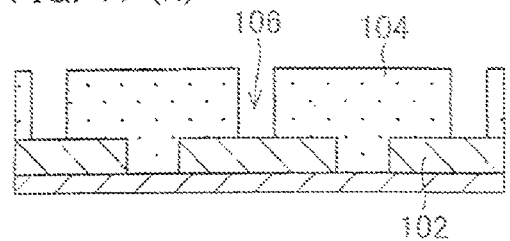
FIG. 17 (i) PRIOR ART
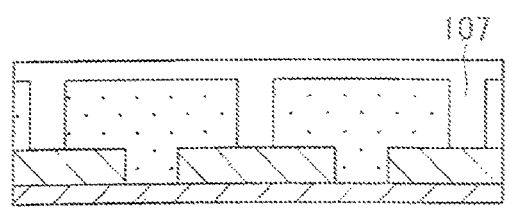
FIG. 17 (j) PRIOR ART
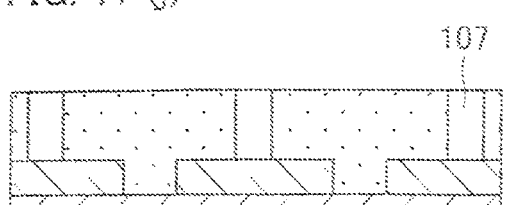

MULTILAYER WIRING BOARD AND METHOD FOR MANUFACTURING MULTILAYER WIRING BOARD

TECHNICAL FIELD

The present invention relates to a method for manufacturing a multilayer wiring board and a multilayer wiring board and, more particularly, to a multilayer wiring board and a method for manufacturing a multilayer wiring board with inkjet technique.

BACKGROUND ART

A conventional method for forming a multilayer interconnection includes a wiring forming step, and a contact hole forming step. In each of a wiring forming step and a contact hole forming step, a deposition step, a photolithography step, an etching step, and a removing step are carried out.

The conventional method for forming a multilayer interconnection is described hereinafter with reference to FIGS. 17(a) through (j). FIGS. 17(a) through (j) are cross sectional views illustrating each step of the conventional method for forming a multilayer interconnection.

As illustrated in FIG. 17(a), in the conventional method for forming a multilayer interconnection, a sputtering film 102 is formed on a glass substrate 101 by sputtering technique. This sputtering film 102 is a lower layer wiring section. After that, as illustrated in FIG. 17(b), in order to process the sputtering film 102 into a desired shape, a photoresist 103 in the desired pattern is arranged to cover on the sputtering film 102 (photolithography step). Then, as illustrated in FIG. 17(c), the sputtering film 102 is etched along the pattern of the photoresist 103 (etching step). Furthermore, as illustrated in FIG. 17(d). the photoresist 103 is removed (removing step). In this way, the sputtering, film 102 (lower layer wiring section) in the desired shape is formed on the glass substrate 101.

Then, on the sputtering film 102 (lower layer wiring section) formed on the glass substrate 101, a contact hole to connect the lower layer wiring section with an upper layer wiring section is to be formed. As illustrated in FIG. 17(e), in an insulating film deposition step, an insulating film 104 is formed to cover the sputtering film 102. Then, as illustrated in FIG. 17(f), in order to form the contact hole at a desired position in the insulating film 104, a photoresist 105 in a desired pattern is arranged to cover the insulating film 104 (photolithography step). After that, as illustrated in FIG. 17(g), the insulating film 104 is etched along the desired pattern of the photoresist 105, so that a contact hole 16 is formed (etching step). Furthermore, as illustrated in FIG. 17(h), the photoresist 105 is removed (removing step).

Moreover, after the removing step, as illustrated in FIG. 17(i), by sputtering technique, a wiring material is embedded into the contact hole 106 formed in the insulating film 104 (step of depositing wiring material for an embedded wiring). A layer made of the wiring material embedded into the contact hole 106 is an interconnection section 107 which connects an upper layer wiring section with the lower layer wiring section. And as illustrated in FIG. 17(j), an extra sputtering film formed on the insulating film 104 in the step of depositing wiring material for an embedded wiring is removed by etching, so that the interconnection section 107 is revealed (etching back step). Furthermore, after the etching back step, an upper layer wiring section is formed on the insulating film 104, which is not illustrated here. In this way, the interconnection section which connects the lower layer wiring section with the upper layer wiring section is formed.

Another method for forming a multilayer interconnection except for the above conventional method, for example, is a method for forming a multilayer interconnection as disclosed in Patent Citation 1 (Japanese Unexamined Patent Application Publication No. 58-176949 published on Oct. 17, 1983). In the method for forming a multilayer interconnection disclosed in Patent Citation 1, a first metal wiring film is mesa etched to leave only a through hole section in a convex shape. After an organic film is applied to expose the convex section of the first metal wiring film, which is formed by mesa etching, a second metal wiring film is formed. Thus, in the interconnection section (the convex section) between the first and second metal wiring films, a highly reliable through hole interconnection can be formed without causing defects such as disconnection and the like.

As a method to form an interconnection section to connect an upper layer wiring section with a lower layer wiring section, the following method is proposed except for the method for embedding a wiring material into a contact hole.

As illustrated in FIGS. 18(a) through (c), in the proposed method, by inkjet technique, ink droplets made of a wiring material are dropped in a contact hole and baked, so that an interconnection section is formed.

However, the methods for forming a multilayer interconnection described above are facing the following problems.

In the method for forming a multilayer interconnection illustrated in FIGS. 17(a) through (j), the wiring material is embedded into the contact hole 106 by sputtering technique, so that the interconnection section 107 is formed. This contact hole 106 is a very narrow region. Therefore, as illustrated in FIG. 17(i), when the wiring material is embedded into the very narrow contact hole, a void or disconnection may be caused at the formed interconnection section 107 affected by foundations such as a shape of a cross section of the contact hole 106 or the like (becoming inverse tapered shape, or large aspect ratio). Therefore, the method for forming a multilayer interconnection illustrated in FIGS. 17(a) through (j), the void, disconnection, or the like can be caused at the interconnection section 107 between the upper layer wiring section and the lower layer wiring section, and the interconnection section 107 between the upper layer wiring section and the lower layer wiring section faces a problem of reliability.

In the method for forming an interconnection section by dropping ink droplets made of the wiring material in the contact hole by inkjet technique and baking the ink droplets, the interconnection section between the upper layer wiring section and the lower layer wiring section faces the problem of the reliability, too. A conventional shape of a contact hole, as illustrated in FIG. 18(a), is box shaped seen from the upper layer wiring section. When the ink droplets are dropped in such a box shaped contact hole and baked, a cross section of the interconnection section formed by baking becomes deformative as illustrated in FIG. 18(b). Thus, the connection with the upper layer wiring section is not sufficient at this interconnection section. Moreover, as illustrated in FIG. 18(c), when a contact hole is more deeply formed, the cross section of the interconnection section, formed by dropping and baking the ink droplets, is further deformed, and accordingly the connection with the upper layer wiring section is not sufficient.

DISCLOSURE OF INVENTION

The present invention is accomplished in view of the problems discussed above. An object of the present invention is to provide a multilayer wiring board which can provide a highly reliable multilayer interconnection, and a method for manufacturing a multilayer wiring board.

As a result of a keen examination in view of the problems, the inventor has discovered an ink behavior characteristic that when ink droplets including a wiring material is dropped in a linewidth region where regions having different linewidths are connected, a film thickness of a baked product of the ink droplets becomes different between at a narrow line region (relatively narrow linewidth region) and at a wide line region (relatively wide linewidth region), and the present invention was brought to completion.

In order to achieve the above object, a multilayer wiring board of the present invention includes a lower layer wiring and an upper layer wiring formed above the lower layer wiring with an interlayer insulating layer provided therebetween, the interlayer insulating layer having a contact hole to connect the upper layer wiring with the lower layer wiring, and the contact hall having an inner wall surrounding a region having a linewidth region where regions having different linewidths are connected.

With this configuration, a region surrounded by an inner wall forming the contact hole has a linewidth region where regions having a different linewidth are connected. When ink droplets including a wiring material are dropped in such contact hole, the dropped ink droplets rise at a relatively narrow linewidth region among regions having different linewidths. As a result, a film thickness of a baked product of the ink droplets is thicker at the relatively narrow linewidth region than at the relatively wide linewidth region. That is, a film thickness distribution of the baked product of the ink droplets rises at the relatively narrow linewidth region.

Accordingly, with this configuration, compared with a multilayer wiring board having a conventional shaped contact hole (a contact hole in a shape illustrated in FIG. 18(a)), the baked product of the ink droplets properly comes into contact with the upper layer wiring. Therefore, a highly reliable multilayer interconnection (baked product of the ink droplets) can be provided between the lower layer wiring and the upper layer wiring.

Also, in order to achieve the above object, a multilayer wiring board of the present invention includes a lower layer wiring and an upper layer wiring formed above the lower layer wiring, the lower layer wiring being formed by dropping ink droplets including a wiring material, and having a wiring pattern having a linewidth region where regions having different linewidths are connected, a relatively narrow linewidth region among the regions having different linewidths being arranged at that region of the lower layer wiring which is overlapped by the upper layer wiring.

With this configuration, the lower layer wiring is formed by dropping ink droplets including a wiring material, and has a wiring pattern having a linewidth region where regions having different linewidths are connected, and a relatively narrow linewidth region among the regions having different linewidths is arranged at that position of the lower layer wiring, which is overlapped by the upper layer wiring. Herewith, a baked product of the ink droplets, which rises at the relatively narrow linewidth region according to the ink behavior characteristic, comes into contact with the upper layer wiring. Consequently, this configuration makes it possible to attain a multilayer wiring board, in which a lower layer wiring and an interconnection section electrically conducted with the lower layer wiring can be formed at the same time.

Therefore, with this configuration, the processing steps can be eliminated, and a highly reliable multilayer interconnection can be provided.

Also, a method for manufacturing a multilayer wiring board of the present invention, in order to achieve the above object, includes: forming a contact hole, in an interlayer insulating layer, for connecting an upper layer wiring and a lower layer wiring; forming an interconnection section by dropping, in the contact hole, ink droplets including a wiring material, the interconnection section electrically connecting the upper layer wiring with the lower layer wiring, wherein in the step of forming the contact hole, the contact hole is formed in such a manner that a region surrounded by an inner wall forming the contact hole has a linewidth region where regions having different linewidths are connected.

With this configuration, in the step of forming the contact hole, the contact hole is formed in such a manner that a region surrounded by an inner wall forming the contact hole has a linewidth region where regions having different linewidths are connected. Herewith, the ink droplets dropped in the interconnection section forming step rise at a relatively narrow linewidth region among the regions having different linewidths. As a result, the film thickness of the interconnection section is thicker at the relatively narrow linewidth region than at the relatively wide linewidth region. In other words, the film thickness distribution of the interconnection section rises at the relatively narrow linewidth region.

Accordingly, with this configuration, the interconnection section successfully comes into contact with the upper layer wiring. Thereby, a highly reliable multilayer interconnection can be provided between the lower layer wiring and the upper layer wiring.

Moreover, in order to achieve the above object, a method for forming manufacturing a multilayer wiring board of the present invention includes: forming a bank on a substrate in such a manner that a region surrounded by the bank is a linewidth region where regions having different linewidths are connected; forming a lower layer wiring by dropping ink droplets in the region surrounded by the bank, the ink droplets including a wiring material; and forming an upper layer wiring above the lower layer wiring in such a manner to overlap a relatively narrow linewidth region among the regions having different linewidths.

In the method for forming a multilayer interconnection disclosed in Patent Citation 1, a highly reliable interconnection between the upper layer wiring and the lower layer wiring can be provided. However, in order to leave only a through hole in a convex shape, this method requires several steps such as a step of forming a masking layer in the through hole of a first metal wiring film by photolithography technique, a mesa etching step and the like. Therefore, in the method for forming a multilayer interconnection disclosed in Patent Citation 1, the work efficiency will be lowered and the cost will increase.

However, the above configuration does not bring such problems like the lower work efficiency and the increasing cost.

With the above configuration, in the step of forming the bank, the bank is formed on a substrate in such a manner that a region surrounded by the bank has a linewidth region where regions having different linewidths are connected. Accordingly, when ink droplets are dropped in the step of forming the wiring, the ink droplets show the ink behavior characteristic. More specifically, the dropped ink droplets rise at a relatively narrow linewidth region among the regions having different linewidths. Also, with this configuration, in the step of forming the upper layer wiring, the upper layer wiring is formed above the lower layer wiring in such a manner to overlap the relatively narrow linewidth region among the regions having different linewidths, so that a baked product of the ink droplets, which rises at the relatively narrow linewidth region, comes into contact with the upper layer wiring. Accordingly, with this configuration, a lower layer wiring and a contact hole electrically conducted with the lower layer wiring can be simultaneously formed. In this configuration, the relatively narrow linewidth region among the regions having different linewidths is formed as an interconnection section, and the relatively wide linewidth region among the regions having different linewidths is formed as a lower layer wiring.

Furthermore, with the above configuration, the bank is formed in the step of forming the bank. Thereby, with one photolithography step, the lower layer wiring and the interconnection section connected with the lower layer wiring can be simultaneously formed. That is, by utilizing the ink behavior characteristic, the processing steps can be eliminated, compared with the conventional method. Accordingly, with this configuration, the process steps can be shortened and a highly reliable multilayer interconnection can be provided.

Additional objects, features, and strengths of the present invention will be made clear by the description below.

BRIEF DESCRIPTION OF DRAWINGS

FIGS. 12(a) through (d) are plan views illustrating a wiring line having the protruding pattern. FIGS. 12(e) through (h) are cross sectional views respectively taken along line A-A' of each multilayer wiring board in FIGS.

12(a) through (d), which is produced when each wiring line illustrated in FIGS. 12(a) through (d) is formed. FIGS. 12(i) through (l) are plan views illustrating a wiring line having the constriction pattern. FIGS. 12(m) through (p) are cross sectional views respectively taken along line B-B' of each multilayer wiring board in FIGS. 12(i) through (l), which is produced when each wiring line illustrated in FIGS. 12(i) through (l) is formed.

FIGS. 13(a) and (b) are plan views illustrating a wiring line having the protruding pattern. FIGS. 13(c) and (d) are cross sectional views respectively taken along A-A' of each multilayer wiring board in FIGS. 13(a) and (b), which is produced when each wiring line illustrated in FIGS. 13(a) and (b) is formed. FIGS. 13(e) and (f) are plan views illustrating a wiring line having the constriction pattern. FIGS. 13(g) and (h) are cross sectional views respectively taken along line B-B' of each multilayer wiring board in FIGS. 13(e) and (f), which is produced when each wiring line illustrated in FIGS. 13(e) and (f) is formed.

FIG. 17(a) is a cross sectional view of one of the steps of a conventional method for forming a multilayer interconnection.

FIG. 17(b) is a cross sectional view of one of the steps of a conventional method for forming a multilayer interconnection.

FIG. 17(c) is a cross sectional view of one of the steps of a conventional method for forming a multilayer interconnection.

FIG. 17(d) is a cross sectional view of one of the steps of a conventional method for forming a multilayer interconnection.

FIG. 17(e) is a cross sectional view of one of the steps of a conventional method for forming a multilayer interconnection.

FIG. 17(f) is a cross sectional view of one of the steps of a conventional method for forming a multilayer interconnection.

FIG. 17(g) is a cross sectional view of one of the steps of a conventional method for forming a multilayer interconnection.

FIG. 17(h) is a cross sectional view of one of the steps of a conventional method for forming a multilayer interconnection.

FIG. 17(i) is a cross sectional view of one of the steps of a conventional method for forming a multilayer interconnection.

FIG. 17(j) is a cross sectional view of one of the steps of a conventional method for forming a multilayer interconnection.

BEST MODE FOR CARRYING OUT THE INVENTION

[Embodiment 1]

One embodiment of the present invention is described below. A method for forming a multilayer interconnection of this embodiment relates to a method for forming a wiring by dropping ink droplets made of a wiring material. The inventor of the present invention has found an ink behavior characteristic that when ink droplets including a wiring material (hereinafter, described as ink) are dropped in a linewidth region where regions having different linewidths are connected, a film thickness of an ink baked product becomes different between at a narrow line region (a relatively narrow linewidth region) and at a wide line region (a relatively wide linewidth region).

Figure 1:
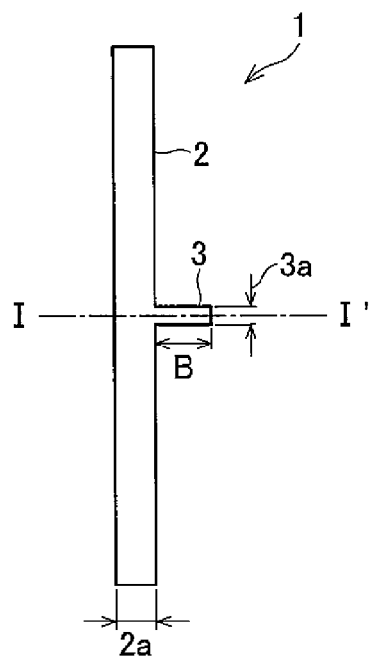
FIG. 1(a) is a plan view illustrating a configuration of a protruding pattern, which illustrates an ink behavior characteristic when the ink is dropped in the protruding pattern as a pattern where regions having different linewidths are connected.
FIG. 1(b) is a graph illustrating a film thickness distribution of an ink baked product formed by dropping the ink in the protruding pattern illustrated in FIG. 1(a).
Figure 1:
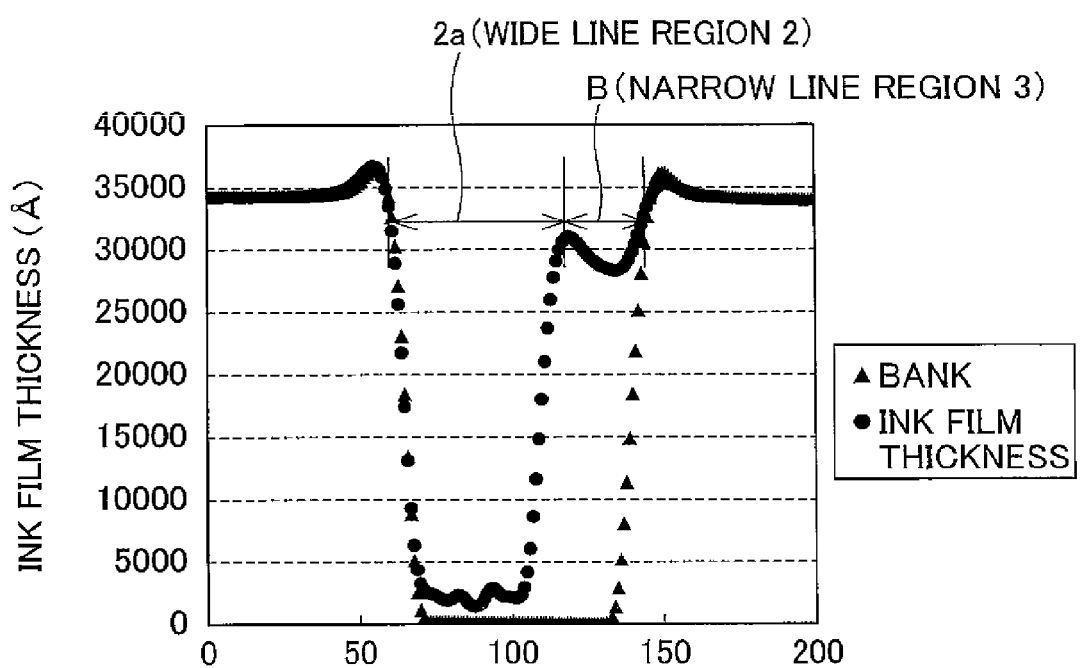
Figure 2:
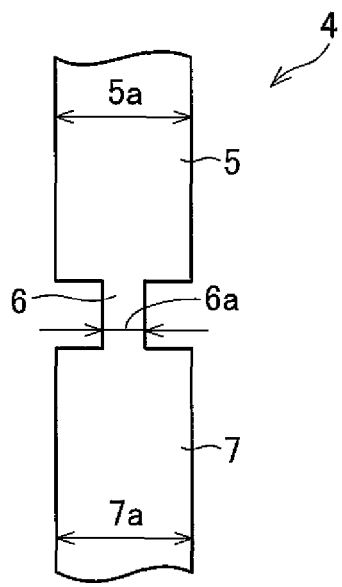
FIG. 2(a) is a plan view illustrating a configuration of a constriction pattern, which illustrates an ink behavior characteristic when the ink is dropped in the constriction pattern where regions having different linewidths are connected.
FIG. 2(b) is a graph illustrating linewidth-ratio dependence in a film thickness of an ink baked product formed by dropping the ink in the constriction pattern illustrated in FIG. 2(a).
Figure 2:
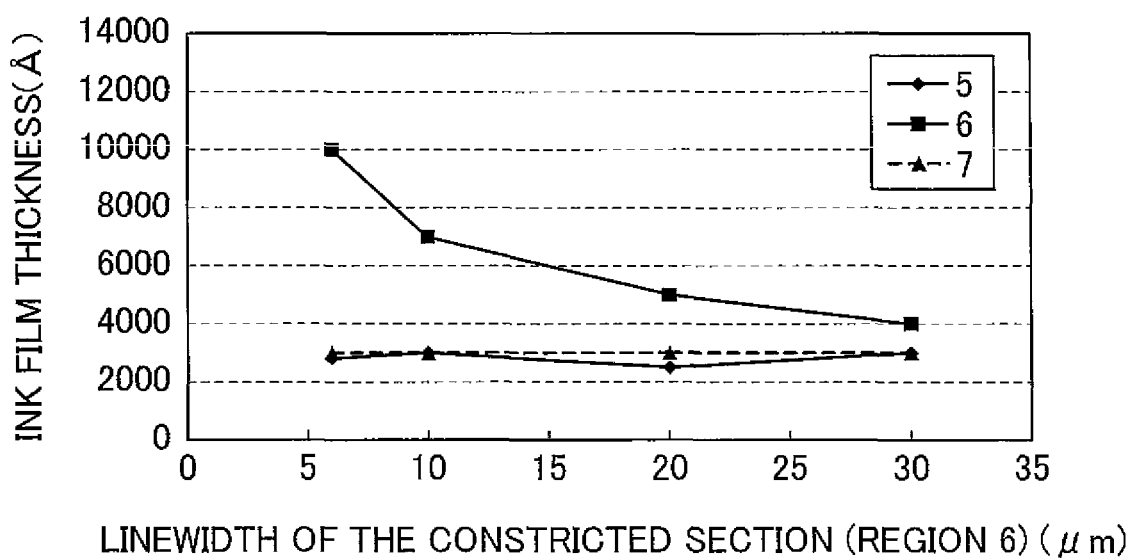

The following describes the ink behavior characteristic with reference to FIGS. 1(a) and (b), and FIGS. 2(a) and (b). FIGS. 1(a) and (b) illustrate an ink behavior characteristic when ink is dropped in a protruding pattern (gate pattern), which is a pattern where regions having different linewidths are connected. FIG. 1(a) is a plan view of a configuration of a protruding pattern, and FIG. 1(b) is a graph illustrating a film thickness distribution at a cross section taken along line I-I' of an ink baked product which is provided by dropping the ink in the protruding pattern.

As illustrated in FIG. 1(a), a protruding pattern 1 has a wide line region 2 and a narrow line region 3. The wide line region has a linewidth 2a, and the narrow line region 3 has a linewidth 3a. The linewidth 2a is wider than the linewidth 3a. In the protruding pattern 1, it is arranged such that only a length B of the narrow line region 2 sticks out from the wide line region 2. The term "pattern" here encompasses a wiring line pattern where the ink is dropped as well as a pattern of the ink baked product (wiring pattern) provided by dropping and baking the ink.

When the ink is dropped in the protruding pattern 1 and baked, the ink baked product has a difference in the film thickness between at the wide line region and at the narrow line region. As illustrated in FIG. 1(b), the film thickness of the ink baked product at the cross section taken along line is wider at the narrow line region 3 having the linewidth 3a than at the wide line region 2 having the linewidth 2a. That is, the film thickness distribution of the ink baked product at the cross section taken along line I-I' rises at the narrow line region 3 where a linewidth is relatively narrow.

As described above, the inventor has discovered the ink behavior characteristic that when the ink is dropped in the protruding pattern, the ink baked product rises at the narrow line region.

The inventor has also found that the ink behavior characteristic can be seen when the ink is dropped in a constriction pattern. The following describes about the ink behavior characteristic when the ink is dropped in the constriction pattern with reference to FIGS. 2(a) and (b).

FIGS. 2(a) and (b) illustrate an ink behavior characteristic when ink is dropped in a constriction pattern where regions having different linewidths are connected. FIG. 2(a) is a plan view illustrating a configuration of a constriction pattern. FIG. 2(b) is a graph illustrating linewidth-ratio dependence (film thickness of each region when a linewidth 6a of a narrow line region 6 is changed while a linewidth 5a of a wide line region 5 and a linewidth 7a of a wide line region 7 are fixed at 40 µm).

As illustrated in FIG. 2(a), a constriction pattern 4 has a wide line region 5, a narrow line region 6 (constricted region), and a wide line region 7. The wide line region 5 and the wide line region 7 respectively have a linewidth 5a and a linewidth 7a, and the narrow line region 6 has a linewidth 6a. The linewidths 5a and 7a are larger than the linewidth 3a. That is, the constriction pattern is arranged in such a manner that the section of the narrow line region 6 is constricted. In FIG. 2(a), the linewidth 5a is as long as the linewidth 7a.

When the ink is dropped in the constriction pattern 4, the ink baked product has a difference in the film thickness between at the wide line regions 5 and 7 and at the narrow line region 6. The film thickness distribution of the ink baked product relatively rises at the narrow line region 6.

As illustrated in FIG. 2(b), the film thickness of the ink baked product at the narrow line region 6 shows the linewidth-ratio dependence, in which the film thickness at the narrow line region 6 varies depending on the linewidth ratio of the wide line region 5 to the narrow line region 6. In other words, the difference of the film thickness of the ink baked product between at the wide line region 5 and at the narrow line region 6 becomes larger according as the ratio of the wide line region 5 to the narrow line region (the wide line region 5/the narrow line region 6) becomes larger. In FIG. 2(b), the linewidth 6a is changed while the linewidth 5a of the wide line region 5 and the line width 7a of the wide line region 7 are fixed at 40 µm. At this time, the film thickness of the ink baked product is virtually constant at the wide line regions 5 and 7 even when the linewidth of the narrow line region 6 is changed. On the contrary, the film thickness of the ink baked product becomes thicker at the narrow line region 6 according as the linewidth 6a of the narrow line region 6 becomes narrower.

Such linewidth-ratio dependence of the film thickness of the ink baked product can be seen in the protruding pattern illustrated in FIG. 1. In FIG. 1(a), the film thickness of the ink baked product at the narrow line region 3 becomes thicker according as the linewidth ratio of the wide line region 2 to the narrow line area 3 (the linewidth 2a/the linewidth 3a) becomes larger.

A direction to measure each "linewidth" of the "relatively narrow linewidth region" and the "relatively wide linewidth region" is a vertical direction to the longitudinal direction of each region. When a linewidth region has a protruding pattern, as illustrated in FIG. 1, the linewidth 3a of the narrow line region (protruding region) 3 is measured in a vertical direction to the longitudinal direction of the narrow line region 3. The linewidth 2a of the wide line region 2 is measured in a vertical direction to the longitudinal direction of the wide line region 2.

When a linewidth region has a constriction pattern, as illustrated in FIG. 2(a), the linewidth 6a of the narrow line region (constricted region) 6 is measured in a vertical direction of the longitudinal direction of the narrow line region 6. The linewidth 5a of the wide line region 5 and the linewidth 7a of the wide line region 7 are measured in a vertical direction to the longitudinal direction of the wide line regions 5 and 7.

When the "relatively narrow linewidth region" and the "relatively wide linewidth region" are in a symmetrical shape such as a square or the like and it is difficult to identify a longitudinal direction, the "linewidth" is measured in a direction parallel to a direction which defines a width of the symmetrical shape.

A multilayer wiring board of Embodiment 1 takes the advantages of the ink behavior characteristic described above. By taking the advantages of this ink behavior characteristic, a highly reliable multilayer interconnection can be provided. The following is an explanation about a multilayer wiring board of Embodiment 1 with reference to FIGS. 3(a) and (b) through FIGS. 5(a) and (b). FIGS. 3(a) and (b) illustrate a configuration of a multilayer wiring board of Embodiment 1. FIG. 3(a) is a top view, and FIG. 3(b) is a cross sectional view taken along line II-II' of FIG. 3(a).

As illustrated in FIGS. 3(a) and (b), a multilayer wiring board of Embodiment 1 (hereinafter, referred to as the multilayer wiring board) includes a lower layer wiring 8 and an upper layer wiring 10. In the multilayer wiring board, an interlayer insulating layer 9 is formed between the lower layer wiring 8 and the upper layer wiring 10. In the interlayer insulating layer 9, a contact hole 11 to connect the lower layer wiring 8 with the upper layer wiring 10 is formed.

Inside the contact hole 11, an ink baked product 12 is formed. The ink is dropped into the contact hole 11 and baked so that the ink baked product 12 is formed. The ink baked product 12 comes into contact with the lower layer wiring 8 and the upper layer wiring 10, so that the lower layer wiring 8 is electrically conducted with the upper layer wiring 10.

In the multilayer wiring board, the contact hole region is formed of the protruding pattern. The term "contact hole region" here is a region surrounded by an inner wall 13 which forms the contact hole 11. As illustrated in FIG. 3(a), the contact hole region includes a wide line region 13A and protruding regions 13B and 13C. The wide line region 13A and the protruding regions 13B and 13C are connected. The protruding regions 13B and 13C stick out from the wide line region 13A. Linewidths of the protruding regions 13B and 13C are arranged to be narrower than a linewidth of the wide line region 13A. The contact hole region in accordance with the multilayer wiring board should be such that at least a part of the contact hole region has a different linewidth from other linewidth regions.

A method for manufacturing the multilayer wiring board includes: forming a contact hole in the interlayer insulating layer 9 so that the upper layer wiring 10 is connected with the lower layer wiring 8 (contact hole forming step); and forming an interconnection section by dropping ink droplets including a wiring material (ink) in the contact hole 11 so that the upper layer wiring 10 is electrically conducted with the lower layer wiring 8 (interconnection section forming step).

In the contact hole forming step, the contact hole is formed in such a manner that a region surrounded by the inner wall 13 which forms the contact hole 11 (contact hole region) has a linewidth region where regions having different linewidths are connected.

When the ink is dropped in such contact hole 11, the dropped ink rises at the protruding regions 13B and 13C. Consequently, as illustrated in FIG. 3(b), the film thickness of the ink baked product 12 is thicker at the protruding regions 13B and 13C than at the wide line region 13A. That is, the film thickness distribution of the ink baked product 12 rises at the protruding regions 13B and 13C.

Figure 18:
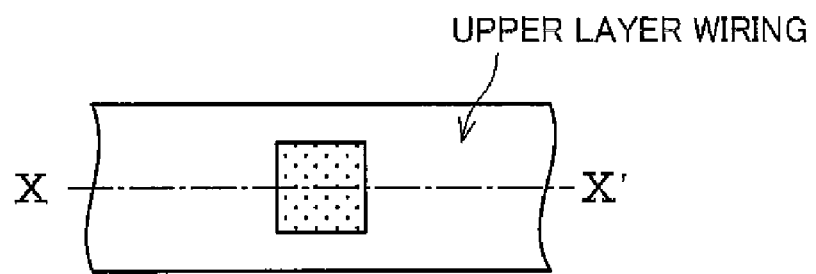
FIG. 18(a) is a top view of a configuration of a conventional multilayer wiring board.
FIG. 18(b) is a cross sectional view taken along line X-X' of FIG. 18(a).
FIG. 18(c) is a cross sectional view illustrating a configuration of a multilayer wiring board, in which a contact hole is more deeply formed.
Figure 18:
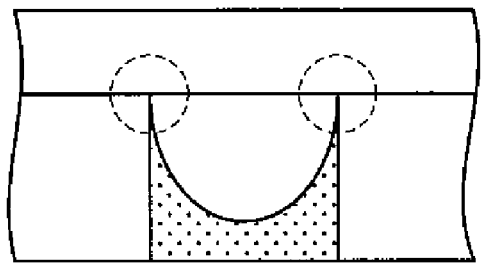
Figure 18:
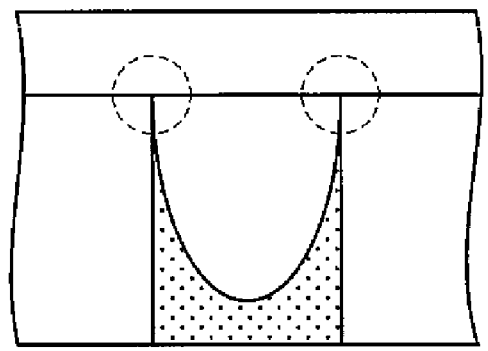

In the multilayer wiring board, compared with a multilayer wiring board having a contact hole illustrated in FIG. 18 (a), the ink baked product 12 is successfully connected with the upper layer wiring 10. Thereby, a highly reliable multilayer interconnection (ink baked product 12) can be provided between the lower layer wiring 8 and the upper layer wiring 10.

The contact hole region illustrated in FIG. 3(a) includes two protruding regions. However, if the contact hole region in the multilayer wiring board has at least one protruding region, it is not especially limited. With the contact hole region having at least one protruding region, the ink behavior characteristic in the above protruding pattern can be attained, whereby a highly reliable multilayer interconnection can be provided.

Figure 4:
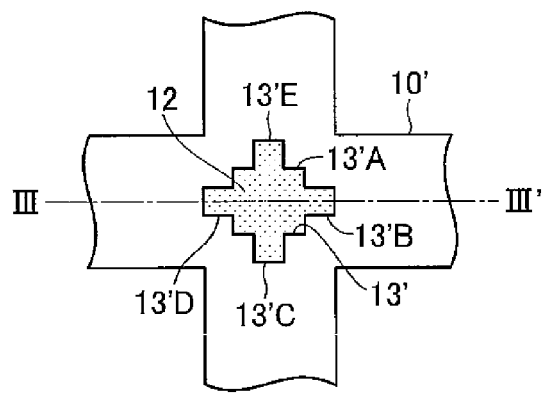
FIG. 4(a) is a top view illustrating a configuration of a multilayer wiring board in accordance with an embodiment of the present invention, in which a contact hole region has 4 protruding regions.
FIG. 4(b) is a cross sectional view taken along line III-III' of FIG. 4(a).
Figure 4:
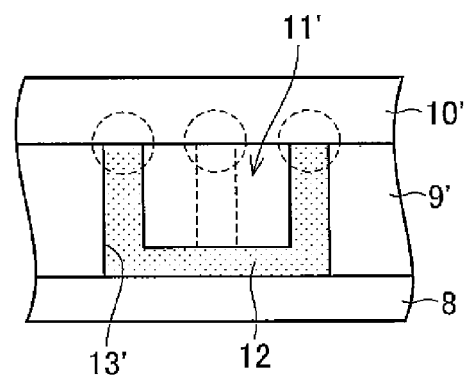
Figure 5:
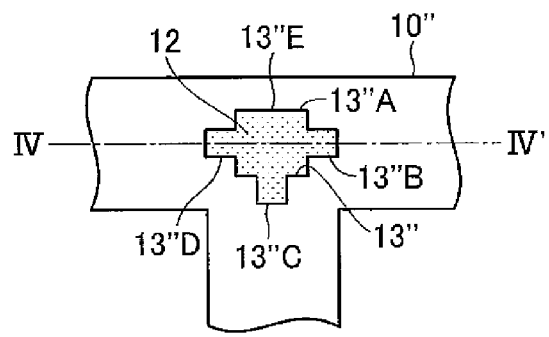
FIG. 5(a) is a top view illustrating a configuration of a multilayer wiring board in accordance with the present invention, in which a contact hole region has 3 protruding regions.
FIG. 5(b) is a cross sectional view taken along line IV-IV' of FIG. 5(a).
Figure 5:
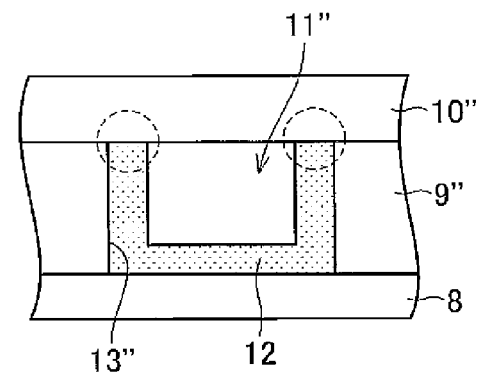

The following describes a configuration of the multilayer wiring board when the contact hole has four or three protruding regions with reference to FIGS. 4(a) and (b), and FIGS. 5(a) and (b). FIGS. 4(a) and (b) illustrate a configuration of the multilayer wiring board, in which the contact hole has four protruding regions. FIG. 4(a) is a top view, and FIG. 4(b) is a cross sectional view taken along line III-III' of FIG. 4(a). FIGS. 5(a) and (b) illustrate a configuration of the multilayer wiring board, in which the contact hole has three protruding regions. FIG. 5(a) is a top view, and FIG. 5(b) is a cross sectional view taken along line IV-IV' of FIG. 5(a).

As illustrated in FIGS. 4(a) and (b), in the multilayer wiring board, a interlayer insulating layer 9' is formed between a lower wiring layer 8 and an upper layer wiring 10'. In the interlayer insulating layer 9', a contact hole 11' is formed to interconnect the lower layer wiring 8 with the upper layer wiring 10'. Inside the contact hole 11', an ink baked product 12 is formed. The upper layer wiring 10', as illustrated in FIG. 4(a), is a cross shaped wiring pattern, and the contact hole 11' is provided at an intersection of the cross shaped wiring pattern in the upper layer wiring 10'.

As illustrated in FIG. 4(a), the contact hole region includes a wide line region 13'A and protruding regions 13'B through 13'E. The wide line region 13'A and the protruding regions 13'B through 13'E are connected with each other. Each of the protruding regions 13'A through 13'E is arranged in such a manner to stick out from the wide line region 13'A. The linewidths of the protruding regions 13'B through 13'E are thinner than the linewidth of the wide line region 13'A.

When the ink is dropped in such contact hole 11', the dropped ink rises at the protruding regions 13'B through 13'E. Consequently, as illustrated in FIG. 4(b), the film thickness of the ink baked product 12 is thicker at the protruding regions 13'B through 13'E than at the wide line region 13'A. That is, the film thickness distribution of the ink baked product 12 rises at the protruding regions 13'B through 13'E.

Accordingly, in the multilayer wiring board, the ink baked product 12 has four contact points with the upper layer wiring 10'. Thereby, in the multilayer wiring board illustrated in FIGS. 4(a) and (b), the ink baked product 12 formed inside the contact hole 11' more successfully comes into contact with the upper layer wiring 10'. This makes it possible to attain a more highly reliable multilayer interconnection between the lower layer wiring 8 and the upper layer wiring 10'.

In the multilayer substrate illustrated in FIG. 4(a) and (b), the upper layer wiring 10' has the cross shaped wiring pattern, but the wiring pattern of the upper layer 10' is not limited to the cross shaped wiring pattern. Especially, when the upper layer wiring 10' has the cross shaped wiring pattern, the contact hole region is formed in the shape according to the upper layer wiring pattern. Therefore, it is applicable to an upper layer wiring formed of a thin line, and a low resistant contact hole can be provided.

Moreover, the contact hole region in the multilayer wiring board may have three protruding regions. As illustrated in FIGS. 5(a) and (b), a contact hole 11" is formed in an interlayer insulating layer 9' which interconnects a lower layer wiring 8 with an upper layer wiring 10". As illustrated in FIG. 5(a), the upper layer wiring 10" is formed of a T shaped wiring pattern, and the contact hole 11" is provided at a branch section in the upper layer wiring 10".

As illustrated in FIG. 5(a), a contact hole region includes a wide line region 13"A and protruding regions 13"B through 13"D. The wide line region 13"A and the protruding regions 13"B through 13"D are connected with each other. Each of the protruding regions 13"B through 13"D sticks out from the wide line region 13"A. The linewidths of the protruding region 13"B through 13"D are thinner than the linewidth of the wide line region 13"A.

When the ink is dropped in such contact hole 11", the dropped ink rises at the protruding regions 13"B through 13"D. Consequently, as illustrated in FIG. 5(b), the film thickness of the ink baked product 12 is thicker at the protruding regions 13"B through 13"D than at the wide line region 13"A. That is, the film thickness distribution of the ink baked product rises at the protruding regions 13"B through 13"E.

In the multilayer wiring board illustrated in FIGS. 5(a) and (b), the ink baked product 12 has three contact points with the upper layer wiring 10", and thereby a highly reliable multilayer interconnection can be provided between the lower layer wiring 8 and the upper layer wiring 10".

In the multilayer wiring board illustrated in FIGS. 5(a) and (b), the upper layer wiring 10" has the T shaped wiring pattern, but the wiring pattern of the upper layer wiring 10" is not limited to the T shaped wiring pattern. Especially, when the upper layer wiring 10" has the T shaped wiring pattern, the contact hole region is formed in the shape according to the upper layer wiring pattern. Therefore, this configuration is applicable to an upper layer wiring formed of a thin line, and allows formation of a low resistant contact hole.

Figure 6:
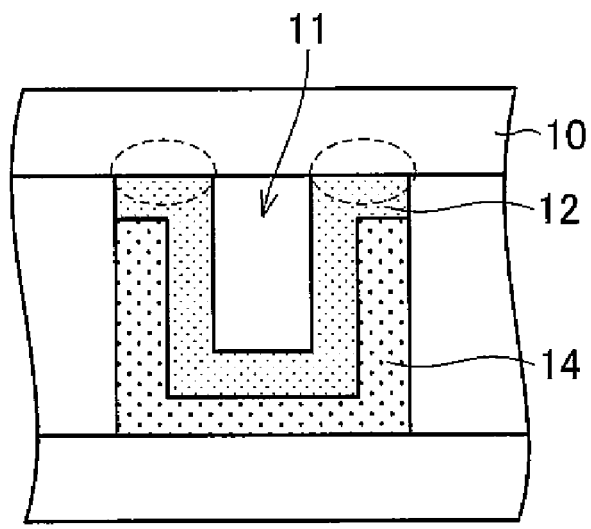
FIG. 6(a) is a cross sectional view illustrating a configuration of a multilayer wiring board, in which a contact hole region has 2 protruding regions and a contact facilitating material is arranged in the contact hole.
FIG. 6(b) is a cross sectional view illustrating a configuration of a multilayer wiring board, in which a contact hole region has 4 protruding regions and a contact facilitating material is arranged in the contact hole.
FIG. 6(c) is a cross sectional view illustrating a configuration of a multilayer wiring board, in which a contact hole region has 3 protruding regions and a contact facilitating material is arranged in the contact hole.
Figure 6:
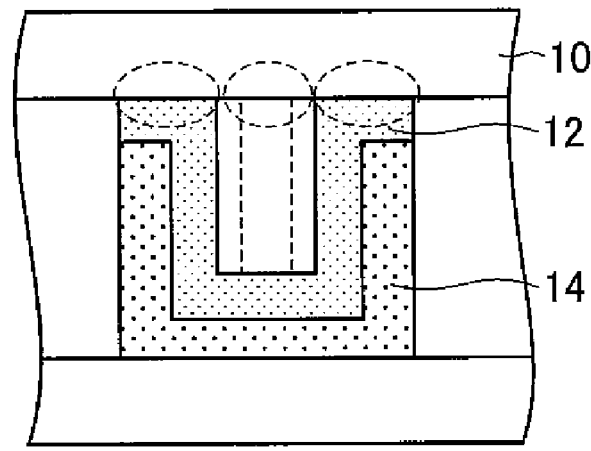
Figure 6:
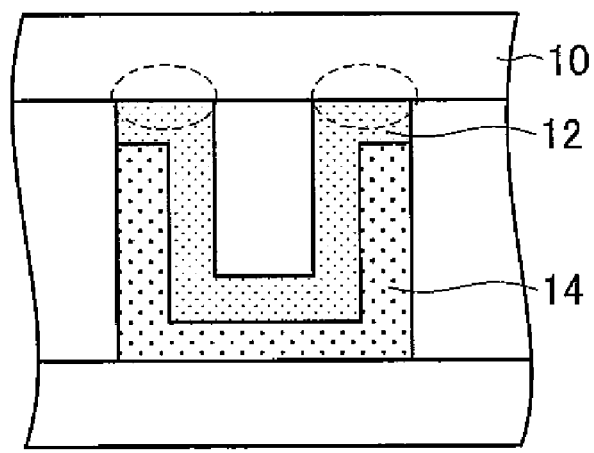

When the contact hole is formed in a more microscopic pattern, or the contact hole is provided in such a manner that the aspect ratio is larger, in the multilayer wiring board, as illustrated in FIGS. 6(a) through (c), a contact facilitating material may be further provided inside the contact hole. FIGS. 6(a) through (c) are cross sectional views illustrating a configuration of a multilayer wiring board, in which a contact facilitating material is provided inside a contact hole. FIG. 6(a) illustrates a contact hole region having two protruding regions, FIG. 6(b) illustrates a contact hole region having four protruding regions, and FIG. 3(c) illustrates three protruding regions.

As illustrated in FIGS. 6(a) through (c), in the multilayer wiring board, a contact facilitating material 14 is formed inside a contact hole 11. An ink baked product 12 or a sputtering film is further formed on the contact facilitating material 14.

The contact facilitating material 14 helps the ink baked product 12 being connected with the upper layer wiring 10. When the contact hole 11 is formed in such a manner that the aspect ratio is larger, the ink may not rise to the level of the upper layer wiring 10. If the contact facilitating material 14 is formed inside the contact hole 11, the dropped ink precisely rises to the upper layer wiring 10. Herewith, the ink baked product 12 formed by baking the dropped ink comes into contact with the upper layer wiring 10.

The contact facilitating material 14 is formed by dropping ink droplets including a material of the contact facilitating material 14 inside the contact hole 11. The material of the contact facilitating material 14 is, for example, ink including metal nanoparticles.

In the multilayer wiring board illustrated in FIGS. 4(a) and (b), and FIGS. 5(a) and (b), the contact hole region has the protruding pattern. However, the contact hole region in the multilayer wiring board is not especially limited, if the contact hole region has the ink behavior characteristic. For example, the contact hole region may have the constriction pattern. Alternatively, the contact hole region may have a pattern in combination with the protruding pattern and the constriction pattern.

Figure 7:
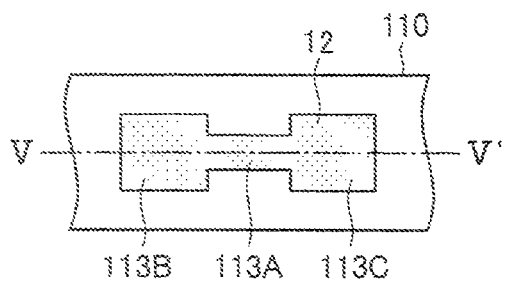
FIG. 7(a) is a top view illustrating a configuration of a multilayer wiring board in accordance with an embodiment of the present invention, in which a contact hole region has a constriction pattern.
FIG. 7(b) is a cross section view taken along line V-V' of FIG. 7(a).
Figure 7:
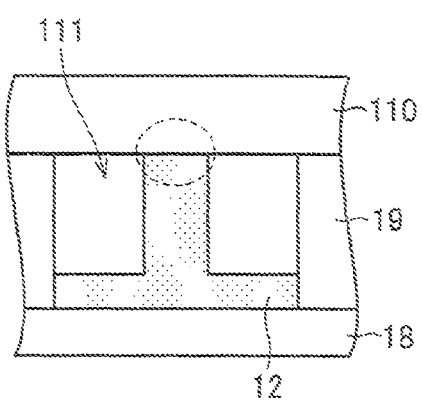

The following describes a configuration of a contact hole having a constriction pattern with reference to FIGS. 7(a) and (b) through FIGS. 9(a) and (b). FIG. 7 illustrates a configuration of the multilayer wiring board, in which a contact hole region has the constriction pattern. FIG. 7(a) is a top view, and FIG. 7(b) is a cross sectional view taken along line V-V' of FIG. 7(a).

As illustrated in FIGS. 7(a) and (b), in the multilayer wiring board, an interlayer insulating layer 19 is formed between a lower layer wiring 18 and an upper layer wiring 110. In the interlayer insulating layer 19, a contact hole 111 is formed, and an ink baked product 12 is formed in the contact hole 111.

As illustrated in FIG. 7(a), the contact hole region includes a constricted region 113A and wide line regions 113B and 113C. The constricted region 113A and the wide line regions 113B are connected with each other. In other words, this contact hole region is a constriction pattern, in which the contact hole region becomes narrow at the constricted region 113A. The linewidth of the constricted region 113A is narrower than the linewidths of the wide line regions 113B and 113C.

When the ink is dropped in such contact hole 111, the dropped ink rises at the constricted region 113A. Consequently, as illustrated in FIG. 7(b), the film thickness of the ink baked product 12 is thicker at the constricted region 113A than at the wide line regions 113B and 113C.

Herewith, in the multilayer wiring board, the ink baked product 12 successfully comes into contact with the upper layer wiring 110. This makes it possible to attain a highly reliable multilayer interconnection between the lower layer wiring 18 and the upper layer wiring 110.

Figure 8:
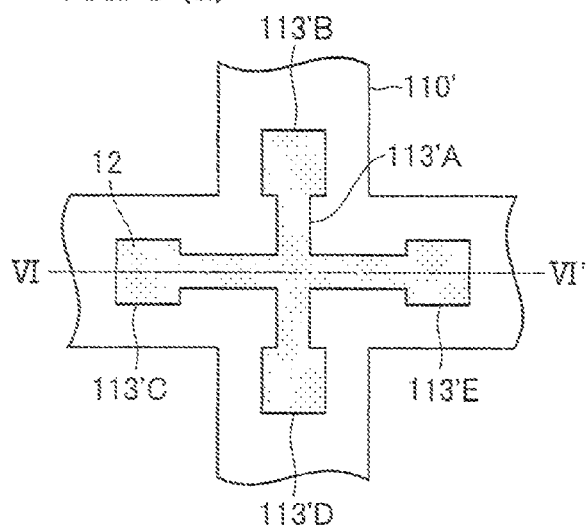
FIG. 8(a) is a top view illustrating another configuration of a multilayer wiring board in accordance with an embodiment of the present invention, in which a contact hole region has the constriction pattern.
FIG. 8(b) is a cross section view taken along line VI-VI' of FIG. 8(a).
Figure 8:
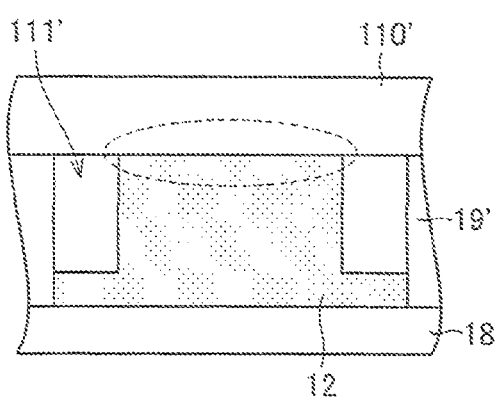

The contact hole region in the multilayer wiring board is not limited to the contact hole region illustrated in FIGS. 7(a) and (b), and may be, for example, such a contact hole region illustrated in FIGS. 8(a) and (b), or FIGS. 9(a) and (b).

As illustrated in FIG. 8(a), in the multilayer wiring board, a contact hole 111' is formed in an interlayer insulating layer 19' so that the lower layer wiring 18 is connected with an upper layer wiring 110'. The upper layer wiring 110', as illustrated in FIG. 8(a), is a cross shaped wiring pattern, and the contact hole 111' is formed at an intersection of the cross shaped wiring pattern in the upper layer wiring 110'.

As illustrated in FIG. 8(a), a contact hole region includes a constricted region 113'A and wide line regions 113'B through 113'E, and the constricted region 113'A and wide line regions 113'B through 113'E are connected with each other. The constricted region 113'A is formed in a cross shape pattern along the wiring pattern of the upper layer wiring 110', and an intersection of this cross shape is corresponding to the intersection of the cross shaped wiring pattern of the upper layer wiring 110'. Each of the wide line regions 113'B through 113'E is formed at each end of the pattern (end of the cross shaped pattern) of the constricted region 113'A along the upper layer wiring 110'. Furthermore, the linewidth of the constricted region 113'A is narrower than the linewidths of the wide line regions 113'B through 113'E.

When the ink is dropped in such contact hole 111', the dropped ink rises at the constricted region 113'A. Consequently, as illustrated in FIG. 8(b), the film thickness of the ink baked product 12 is thicker at the constricted region than at the wide line regions 113'B through 113'E.

Figure 9:
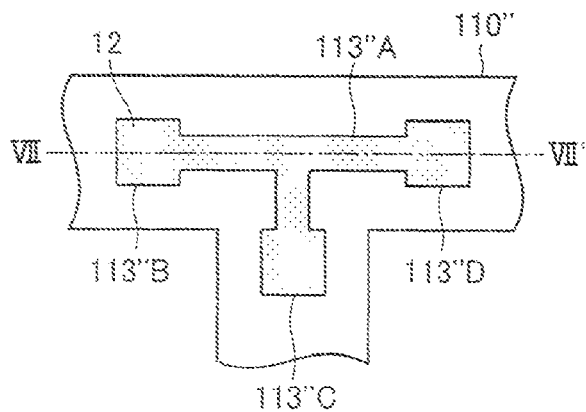
FIG. 9(a) is a top view illustrating further another configuration of a multilayer wiring board in accordance with an embodiment of the present invention, in which a contact hole region has the constriction pattern.
FIG. 9(b) is a cross sectional view taken along line VII-VII' of FIG. 9(a).
Figure 9:
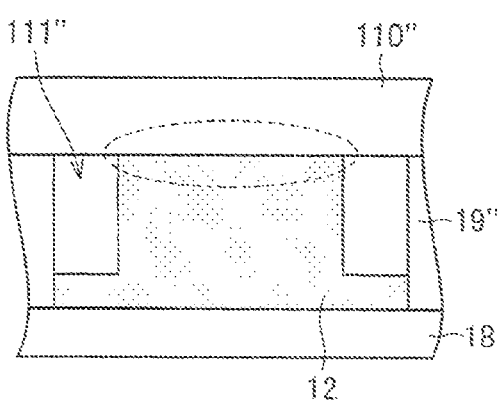

Moreover, when the upper layer wiring has a T shaped wiring pattern, a contact hole region may be the one illustrated in FIG. 9.

As illustrated in FIG. 9(a), a contact hole is formed in an interlayer insulating layer 19" so that a lower layer wiring 18 is connected with an upper layer wiring 110". As illustrated in the figure, in the multilayer wiring board, the upper layer wiring 110" is formed of a T shaped wiring pattern, and the contact hole 111" is provided at a branch section in the upper layer wiring 110".

As illustrated in FIG. 9(a), a contact hole region includes a constricted region 113"A and wide line regions 113"B through 113"D, and the constricted region 113"A and the wide line regions 113"B through 113"D are connected with each other. The constricted region 113"A is formed of a T shaped pattern along the wiring pattern of the upper layer wiring 110", and a branch section of the T shape is corresponding to the branch section of the cross shaped wiring pattern of the upper layer wiring 110". Each of the wide line regions 113"B through 113"D is formed at each end of the pattern (end of the T shaped pattern) of the constricted region 113"A along the upper layer wiring 110". Furthermore, the linewidth of the constricted region 113" is narrower than the linewidths of the wide line regions 113"B through 113"D.

When the ink is dropped in such contact hole 111", the dropped ink rises at the constricted regions 113". Consequently, as illustrated in FIG. 9(b), the film thickness of the ink baked product 12 is thicker at the constricted region 113"A than at the wide line region 113"B through 113"D.

Figure 10:
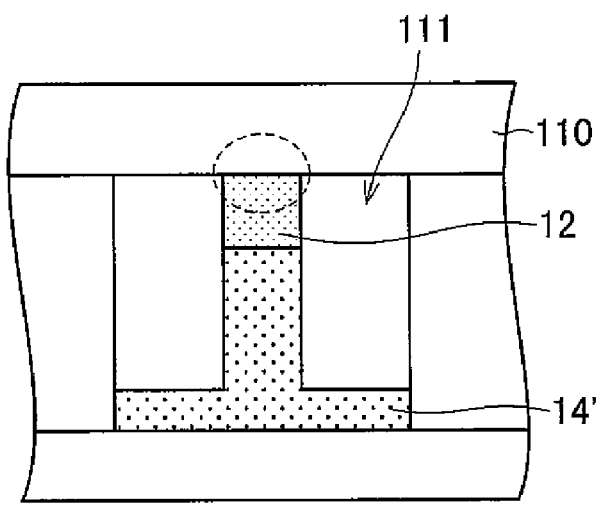
FIG. 10(a) is a cross sectional view illustrating a configuration of a multilayer wiring board having a contact hole region illustrated in FIGS. 7(a) and (b). A contact facilitating material is arranged in the contact hole.
FIG. 10(b) is a cross sectional view illustrating a configuration of a multilayer wiring board having a contact hole region illustrated in FIGS. 8(a) and (b). A contact facilitating material is arranged in the contact hole.
FIG. 10(c) is a cross sectional view illustrating a configuration of a multilayer wiring board having a contact hole region illustrated in FIGS. 9(a) and (b). A contact facilitating material is arranged in the contact hole.
Figure 10:
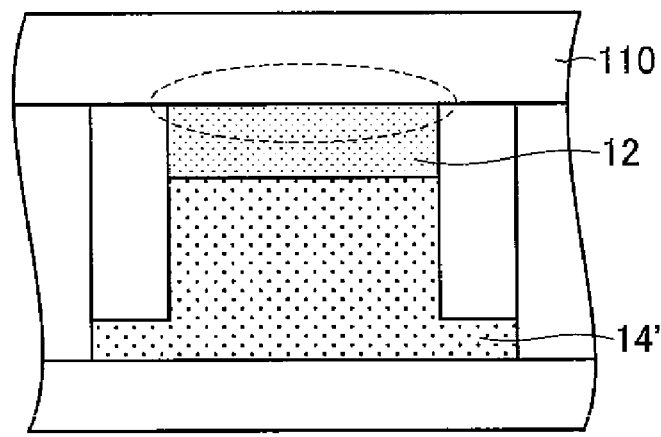
Figure 10:
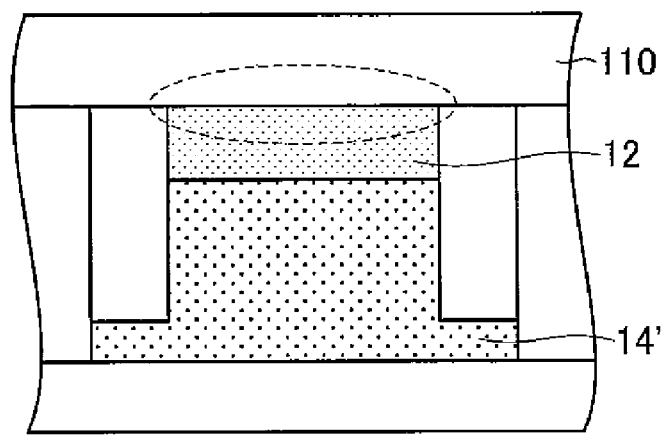

In addition, as described above, when the contact hole region has a constricted pattern, a contact facilitating material may be provided inside the contact hole. FIGS. 10(a) through (c) are cross sectional views illustrated a configuration of a multilayer wring board, in which a contact facilitating material is provided inside a contact hole. FIG. 10(a) illustrates the contact hole region illustrated in FIGS. 7(a) and (b), FIG. 10(b) is the contact hole region illustrated in FIGS. 8(a) and (b), and FIG. 10(c) is the contact hole region illustrated in FIGS. 9(a) and (b).

As illustrated in FIGS. 10(a) through (c), in the multilayer wiring board, a contact facilitating material 14' is provided inside the contact hole 111. The ink baked product 12 or a sputtering film is further formed on the contact facilitating material 14'.

The contact facilitating material 14' helps the ink baked product 12 being connected with the upper layer wiring 110. When the contact hole 111 is formed in such a manner that the aspect ratio is larger, the ink may not rise to the level of the upper layer wiring 10. If the contact facilitating material 14' is provided inside the contact hole 111, the dropped ink rises to the level of the upper layer wiring 110. As a result, the ink baked product 12 which is formed by baking the dropped ink comes into contact with the upper layer wiring 110.

Figure 3:
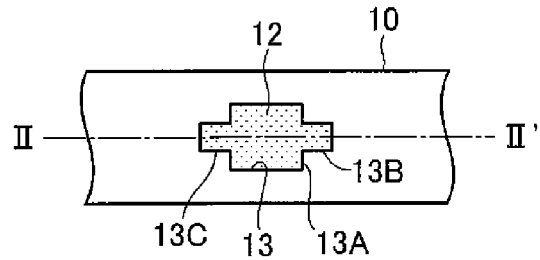
FIG. 3(a) is a top view illustrating a configuration of a multilayer wiring board in accordance with an embodiment of the present invention.
FIG. 3(b) is a cross sectional view taken along line II-II' of FIG. 3(a).
Figure 3:
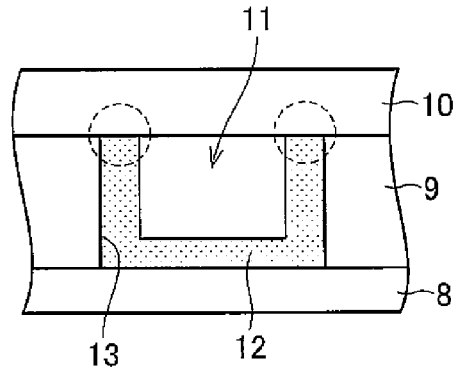

The multilayer wiring board may include a "lower layer wiring" which is formed by baking ink dropped in a "relatively wide linewidth region among regions having different linewidths" in the contact hole region. In such configuration, for example, the ink baked product, which is dropped in the wide line region 13A within the contact hole region illustrated in FIG. 3, is corresponding to the "lower layer wiring". When the ink is dropped in the wide line region 13A, the film thickness distribution of the ink baked product 12 rises at the protruding regions 13B and 13C as described above. In other words, the distribution of the ink baked product does not rises at the wide line region 13A. In the multilayer wiring board, the baked product of the ink dropped in the wide line region 13A can be used as the "lower layer wiring".

Herewith, the "lower layer wiring" (for example, the baked product of the ink dropped in the wide line region 13A in FIG. 3(a)) and an interconnection section (for example, the ink baked product dropped in the protruding regions 13B and 13C in FIG. 3(a)) which interconnects the lower layer wiring with the upper layer wiring can be formed at the same time.

[Embodiment 2]

Another embodiment of the present invention is described as follows.

In the multilayer wiring board of Embodiment 1, the contact hole region has a pattern in which regions having different linewidths are connected. And the ink baked product, that the ink is dropped in the contact hole region and baked, shows the ink behavior characteristic. This makes it possible to attain a highly reliable multilayer interconnection. However, the applicability of the ink behavior characteristic is not limited to the above example. Embodiment 2 describes another example which takes the advantages of the ink behavior characteristics.

In Embodiment 2, the ink behavior characteristic is applied to a method for forming a multilayer interconnection (a method for manufacturing a multilayer wiring board) with inkjet technique. In the method for forming a multilayer interconnection of Embodiment 2, when a multilayer wiring is to be formed, by using inkjet technique, a lower layer wiring and a contact hole wiring (interconnection section) which is to be connected with the lower layer wiring can be formed at the same time. The following describes the method for forming a multilayer interconnection of Embodiment 2.

A method for forming a multilayer interconnection of Embodiment 2 (hereinafter referred to as the method for forming a multilayer interconnection), as illustrated in FIGS. 11(a) through (h), includes: a bank forming step 21; a hydrophilic and hydrophobic treatment step 22; a wiring material applying step 23; a baking step 24; removing step 25; an interlayer insulating film applying step 26; and an etching back step 27.

(Bank Forming Step 21)

Figure 11:
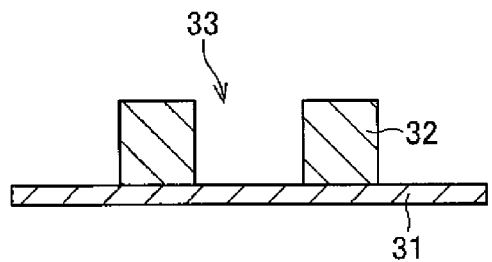
FIG. 11(a) is a cross sectional view illustrating one of the steps of a method for forming a multilayer interconnection in accordance with another embodiment of the present invention.
FIG. 11(b) is a cross sectional view illustrating one of the steps of a method for forming a multilayer interconnection in accordance with another embodiment of the present invention.
FIG. 11(c) is a cross sectional view illustrating one of the steps of a method for forming a multilayer interconnection in accordance with another embodiment of the present invention.
FIG. 11(d) is a cross sectional view illustrating one of the steps of a method for forming a multilayer interconnection in accordance with another embodiment of the present invention.
FIG. 11(e) is a cross sectional view illustrating one of the steps of a method for forming a multilayer interconnection in accordance with another embodiment of the present invention.
FIG. 11(f) is a cross sectional view illustrating one of the steps of a method for forming a multilayer interconnection in accordance with another embodiment of the present invention.
FIG. 11(g) is a cross sectional view illustrating one of the steps of a method for forming a multilayer interconnection in accordance with another embodiment of the present invention.
FIG. 11(h) is a plan view illustrating a wiring guide formed on a substrate.
Figure 11:
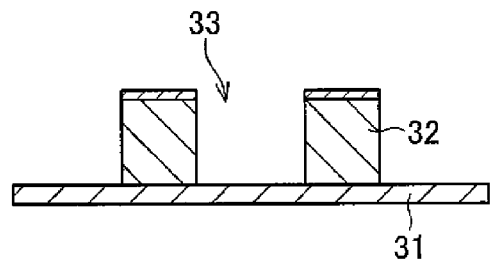
Figure 11:
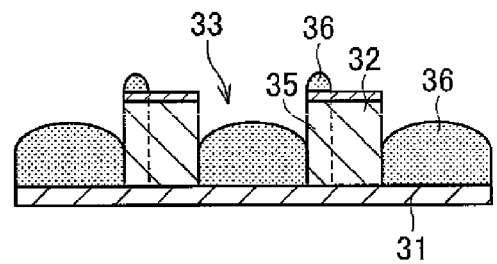
Figure 11:
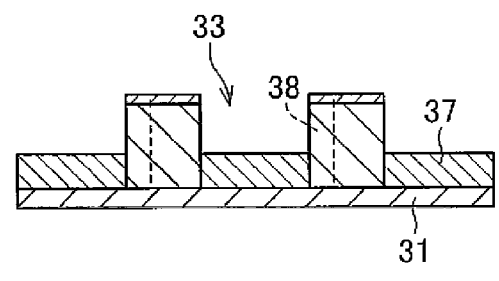
Figure 11:
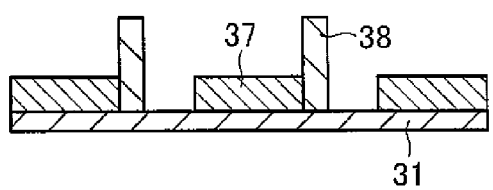
Figure 11:
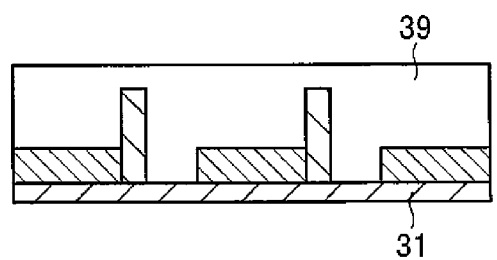
Figure 11:
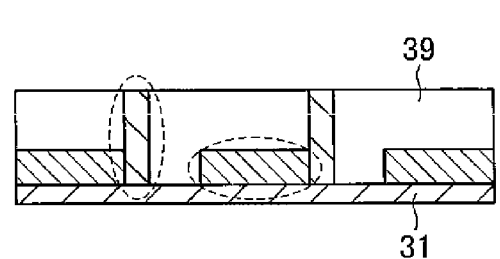
Figure 11:
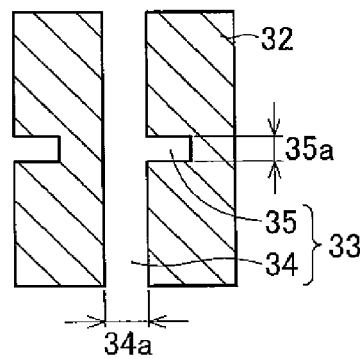

In the bank forming step 21, a wiring guide for the wiring material applying step 23 is to be formed. In the after-mentioned wiring material applying step 23, a wiring is formed by dropping ink by inkjet technique. For that purpose, a wiring guide is formed so that the ink is more properly applied to a wiring forming region by ejecting (dropping) the ink. FIG. 11(a) is a cross sectional view illustrating a wiring guide which is formed on a glass substrate of the multilayer wiring board. FIG. 11(h) is a plan view illustrating a wiring guide which is formed on a glass substrate of the multilayer wiring board.

As illustrated in FIG. 11(a), in the bank forming step 21, a bank 32 is formed on a substrate 31 with a resist material by photolithography. This bank 32 is a wiring guide which controls a liquid current when the ink is dropped in the after-mentioned wiring material applying step 23. A region surrounded by an inner wall of the bank 32 formed on the substrate 31 is a wiring line 33 to form a lower layer wiring. In other words, the wiring line 33 is a guide along a pattern of a lower layer wiring to be formed.

In the method for forming a multilayer interconnection, in the bank forming step, a guide is formed in such a manner that regions having different linewidths become a connected pattern. Herewith, when the ink is dropped in the after-mentioned wiring material applying step, the ink is to show the ink behavior characteristic. That is, a relatively narrow linewidth region among the regions having different linewidths rises.

FIG. 11(h) illustrates an example configuration of a wiring pattern having a protruding pattern, the wiring pattern forming a lower layer wiring. As illustrated in FIG. 11(h), the wiring line 33 includes a wiring forming region 34 and a protruding region 35. The protruding region 35 sticks out from the wiring forming region 34. A linewidth 35a of the protruding region 35 is narrower than a linewidth 34a of the wiring forming region 34. In the after-mentioned wiring material applying step 23, when the ink is dropped in such wiring line 33, the dropped ink rises at the protruding region 35. The ink is baked in the after-mentioned baking step 24, so that a lower wiring and a contact hole wiring (interconnection section) can be formed at the same time.

As a substrate 31, a glass substrate is generally used. However, with the view of forming liquid crystal elements, the substrate 31 is not especially limited to a glass substrate, if necessary properties such as a desired transparency, mechanical strength, or the like are included. For example, the substrate 31 may be a plastic substrate.

As a resin composition material for forming the bank 32, a resist material is used, but also a photosensitive acrylic resin may be used. When the photosensitive acrylic resin is used, the after-mentioned removing step is not required because the photosensitive acrylic resin is transparent. This allows the processing steps to be shortened.

Moreover, photolithography technique is preferably used as a method for patterning the wiring line 33 formed by the bank 32. In the bank forming step 21, patterning the photosensitive acrylic resin is performed in a space width on an order of a few μm. Accordingly, the film thickness of the bank 32 formed by the patterning is from a few thousands Å (a few hundreds nm) to a few μm.

(Hydrophilic And Hydrophobic Treatment Step 22)

A hydrophilic and hydrophobic treatment step 22 is a step for adding hydrophilic property to the wiring line 33, and hydrophobic property to the bank 32. More specifically, in the step, a property of easily getting wet with ink is to be added to the wiring line 33 (hydrophilia), while a property of easily shedding ink is to be added to the bank 32 (hydrophoby).

In this hydrophilic and hydrophobic treatment step 22, plasma treatment with a fluorine gas such as $SF_6$, $CF_4$ or the like is performed to the bank 32 or the wiring 33, so that the hydrophilic property is added to the wiring line 33, and the hydrophobic property is added to the bank 32.

(Wiring Material Applying Step 23)

A wiring material applying step 23 is illustrated in FIG. 11(c). In the wiring material applying step 23, with a pattern forming device (not illustrated), ink 36 made of a wiring material is dropped in the wiring line 31 on the substrate 31. In Embodiment 2, the ink 36 dropped in the wiring line 33 rises at the protruding region 35 according to the ink behavior characteristic.

In the method for forming a multilayer interconnection, hydrophilic property is added to the wiring line 33, and hydrophobic property is added to the bank 32 in the hydrophilic and hydrophobic treatment step 22. Thereby, if the ink 36 is not dropped in a proper position and is dropped in the bank 32, the ink 36 is shed by the hydrophobic coating on the bank 32, and drawn into the wiring line 33.

The ink 36 is ink including metal nanoparticles. The ink 36 consists mostly of an ink solvent, including a few vol % to 10 vol % of solid contents (metal nano particles). Silver (Ag), copper (Cu), and aluminum (Al) are preferably used as metal nano particles included in the ink 36.

Also, any solvents of a solvent made of polar materials and a solvent made of non-polar materials may be used as an ink solvent. When the solvent made of polar materials is used as an ink solvent, the polar materials, for example, may be Methyl Carbitol or Butyl Carbitol. When the solvent made of non-polar materials is used as an ink solvent, the non-polar materials, for example, may be Tetradecane.

(Baking Step 24)

After the wiring material applying step 23, as illustrated in FIG. 11(d), a baking process is performed and the ink solvent included in the ink 36 is removed, so that a lower layer wiring and a contact hole wiring (interconnection section) are simultaneously formed. In the baking step 24, the baked ink 36 dropped in the wiring forming region 34 of the wiring line 33 is conclusively to become a lower layer wiring 37. On the other hand, the baked ink 36 dropped in the protruding region 35 of the wiring line 35 is conclusively to become a contact hole wiring (interconnection section) 38 which interconnects the upper layer wiring with the lower layer wiring.

Furthermore, in the baking process 24, baking is performed at a temperature equal to or higher than a boiling point of an ink solvent in vacuum, in air, in a $N_2$ atmosphere, or in an atmosphere where a mixture ratio of $N_2$ and $O_2$ is changed.

(Removing Step 25)

In the removing step 25, the bank 32 forming the wiring line 33 is removed away.

By this step, the lower layer wiring 37 formed by the baked product of the ink 36 dropped in the wiring forming region 34 and the contact hole wiring 38 formed by the baked product of the ink 36 dropped in the protruding region 35 are exposed on the substrate 31.

(Interlayer Insulating Film Applying Step 26)

After the removing step 25, an interlayer insulating film 39 is applied to the substrate 31 on which the lower layer wiring and the contact hole wiring are formed.

As the interlayer insulating film 37, for example, SOG (Spin On Glass) film may be used. The SOG film is a silicon dioxide film which is formed by an application technique (SOD; Spin on Deposition), and is also called a coating silicon dioxide film. When SOG (Spin On Glass) film is used as the interlayer insulating film 39, for example, the interlayer insulating film can be formed in a concise way (application technique) by spin coating. As a method for forming the interlayer insulating film 39, a silicon dioxide film ($SiO_2$ film) may be formed by a chemical vapor deposition method (CVD), or a sputtering technique.

(Etching Back Step 27)

After the interlayer insulating film 39 is formed, an etching process is performed over the interlayer insulating film 39 by so-called etching back technique, so that the surface of the interlayer insulating film 39 is flattened. This etching process is performed until the contact hole wiring 38 is exposed.

Moreover, after the etching back step, though it is not illustrated here, an upper layer wiring is formed on the surface of the interlayer insulating film 39 where the contact hole wiring 38 is exposed. The upper layer wiring may be formed by conventional sputtering technique, or by inkjet technique.

As described above, in the method for forming a multilayer interconnection, in the bank forming step, a wiring line is formed in such a manner that regions having different linewidths make an connected linewidth pattern. Therefore, when the ink is dropped in the wiring material applying step, the ink shows the ink behavior characteristic. That is, the ink rises at a relatively narrow linewidth region among the regions having different linewidths. This makes it possible to simultaneously form a lower layer wiring and a contact hole wiring (interconnection section) which is electrically conducted with the lower layer wiring. In the method for forming a multilayer interconnection, needless to say, the relatively narrow linewidth region among the regions having different linewidths is formed as a contact hole wiring, and the relatively wide linewidth region among the regions having different linewidths is formed as a lower layer wiring.

A conventional method for forming a multilayer interconnection includes a wiring forming step and a contact hole forming step. In each of the wiring forming step, and a contact hole forming step, a deposition step, a photolithography step, an etching step, and a removing step are carried out. On the contrary, in the method for forming a multilayer interconnection of Embodiment 2, a bank is formed in the bank forming step. Accordingly, with one photolithography step, a lower layer wiring and a contact hole wiring (interconnection section) which is connected with the lower layer wiring can be formed at the same time.

In other words, in the method for forming a multilayer interconnection, by taking the advantages of the above ink behavior characteristic, the deposition step, the photolithography step, the etching step, and the removing step can be skipped. Consequently, in accordance with the method for forming a multilayer interconnection of Embodiment 2, the processing steps can be shortened and a highly reliable multilayer interconnection can be provided.

In the method for forming a multilayer interconnection, the lower layer wiring and the contact hole wiring (interconnection section) which is connected with the lower layer wiring are formed in advance (the bank forming step through the removing step), and then the interlayer insulating film is formed (the interlayer insulating film applying step). Herewith, an interlayer insulating film having fine step coverage can be provided. In the conventional method for forming a multilayer interconnection, after the interlayer insulating film is formed, a wiring material is embedded in a contact hole region, which is formed in the interlayer insulating film, by sputtering technique. In this case, affected by the foundations such as a shape of a cross section of a contact hole (becoming an inverse tapered shape, large aspect ratio) or the like, the step coverage of the interlayer insulating film becomes insufficient. As a result, in the conventional method for manufacturing a multilayer wiring board, a void or disconnection may be caused. On the contrary, in the method for forming a multilayer interconnection of the present invention according to Embodiment 2, the interlayer insulating film is widely applied out of the contact hole region (region where a contact hole wiring is formed), so that the effects of the foundations such as a shape of a cross section of a contact hole (usually an inverse tapered shape) or the like is minimized. As a result, an interlayer insulating film having fine step coverage can be provided.

Moreover, in FIGS. 11(A) through (h), in the bank forming step 21, the bank 32 is formed in such a manner that the wiring line 33 has the protruding pattern. However, the wiring line formed in the bank forming step is not limited to the above protruding pattern, if the ink behavior characteristic is shown and the regions having different linewidths form a connected linewidth region. For example, the wiring line formed in the bank forming step may have a constriction pattern. Also, the wiring line formed in the bank forming step may have a pattern in combination of the protruding pattern and the constriction pattern.

Furthermore, it is preferable that the wiring line to be formed in the bank forming step be formed in such a manner that a section where the upper layer wiring overlaps a relatively narrow linewidth region among the above linewidth regions becomes large. Herewith, a baked product of the ink dropped in the relatively narrow linewidth region among the linewidth regions (contact hole wiring) comes into contact with the upper layer wiring in large area. As a result, the contact hole wiring which electrically conducts the lower layer wiring with the upper layer wiring becomes low resistant, and as electrical density being decreased, a multilayer wiring board which rarely has disconnection can be attained.

Figure 12:
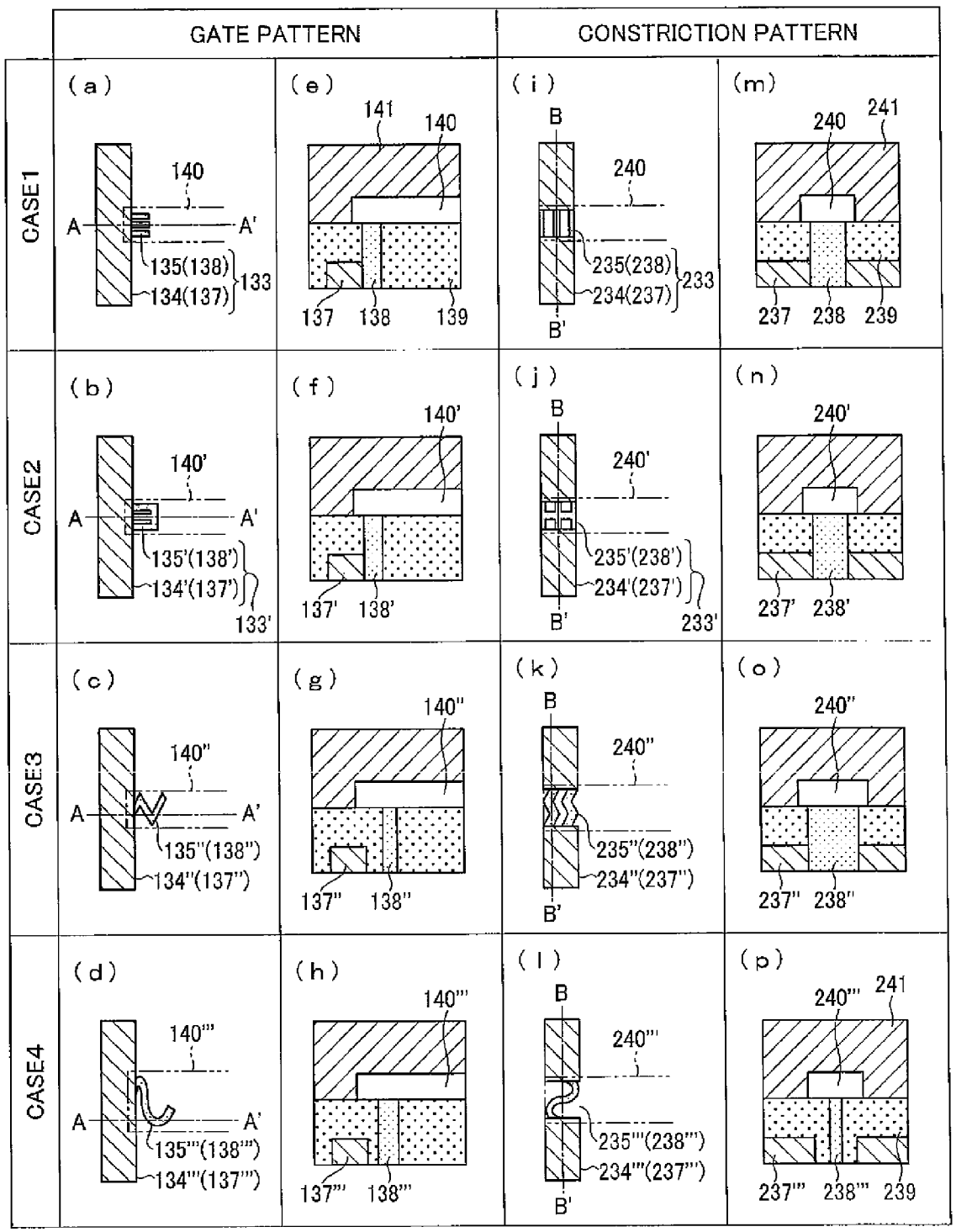
FIG. 12 illustrate example shapes of a wiring line formed in a bank forming step in a method for forming a multilayer interconnection in accordance with another embodiment of the present invention.
Figure 13:
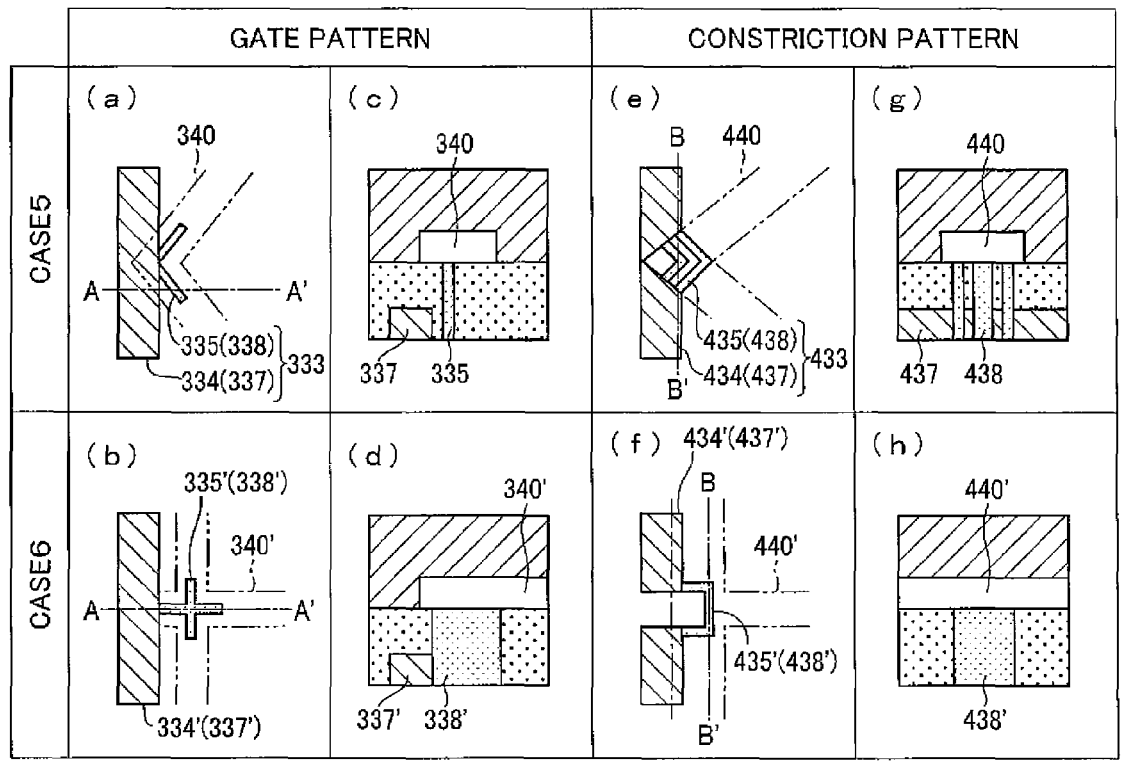
FIG. 13 illustrate further other example shapes of wiring line formed in a bank forming step in a method for forming a multilayer interconnection in accordance with another embodiment of the present invention.

The following more specifically describes a wiring line to be formed in the banking forming step, the wiring line formed in such a manner that the section the upper layer wiring overlaps the relatively narrow linewidth region among the regions having different linewidths becomes large with reference to FIGS. 12 and 13. FIGS. 12(a) through (p) illustrate example shapes of a wiring line to be formed in the bank forming step in accordance with the method for forming a multilayer interconnection. FIGS. 12(a) through (d) are plan views illustrating a wiring line having the protruding pattern. FIGS. 12 (e) through (h) are cross sectional views of a multilayer wiring board taken along line A-A' of FIGS. 12 (a) through (d). The multilayer wiring board is to be manufactured when the wiring line illustrated in FIGS. 12(a) through (d) is formed. FIGS. 12(i) through (l) are plan views illustrating a wiring line having the constriction pattern. FIGS. 12 (m) through (p) are cross sectional views of a multilayer wiring board taken along line B-B' of FIGS. 12 (i) through (l). The multilayer wiring board is to be manufactured when the wiring line illustrated in FIGS. 12(i) through (l) is formed. In FIGS. 12(a) through (d) and FIGS. 12(i) through (l), an upper layer wiring is illustrated for making clear how the upper layer wiring is arranged in a relation with the lower layer wiring.

As illustrated in FIG. 12(a), a wiring line 133 includes a wiring forming region 134 and a protruding region 135. The protruding region 135 is in such a shape that three lanes vertically stick out from the wiring forming region 134. An upper layer is formed at least to overlap the protruding region 135. The tem "overlap" means that orthographs projected on the substrate coincide with each other.

When the ink is dropped in such wiring line 133, the dropped ink rises at the protruding region 135. Then, the ink is baked in the baking step so that a lower layer wiring 137 and a contact hole wiring 138 can be formed at the same time. In the wiring line 133, the baked product of the ink dropped in the wiring forming region 134 is the lower wiring 137, and the baked product of the ink dropped in the protruding region 138 is the contact hole wiring 138. After that, through the interlayer insulating film applying step and the etching back step, the upper layer wiring 140 is formed to be connected with the contact hole wiring 138. Herewith, the multilayer wiring board is manufactured.

As illustrated in FIG. 12(a), in the manufactured multilayer wiring board, the contact hole wiring 138, which is formed at the same time as the lower layer wiring 137 is formed, is connected with the upper layer wiring 140. An interlayer insulating film 139 is provided between the lower layer wiring 137 and the upper layer wiring 140. This interlayer insulating film 139 is formed in the interlayer insulating film applying step. Moreover, a passivation film 141 is formed on the upper layer wiring 140. The passivation film 141 has a function to prevent moisture absorption. The passivation film 141 is formed on the upper layer wiring 140 by depositing a SiN film or the like by CVD method.

The protruding region may be in an inverted "E" shape in FIG. 12(b). In other words, a protruding region 135' may be arranged in such a shape that the three lanes vertically sticking out from a wiring forming region 134' are vertically bended at the ends thereof so that the three lanes are connected. When the ink is dropped in a wiring line 133' having such a shape, as illustrated in FIG. 12(b), a contact hole wiring 138', which is formed at the same time as a lower layer wiring 137' is formed, can be connected with an upper layer wiring 140', too.

Also, the protruding region may be in a shape illustrated in FIG. 12(c). In other words, a protruding region 135" may be in a shape of a zigzag line vertically extending from a wiring forming region 134". Furthermore, the protruding region may be in a shape illustrated in FIG. 12 (d). To put it differently, a protruding region 135''' may be in an S-shaped curve vertically extending from a wiring forming region 134'''.

When the protruding region is in the shape illustrated in FIGS. 12(c) or (d), as illustrated in FIGS. (g) or (h), the contact hole wiring which interconnects the upper layer wiring with the lower layer wiring can be provided.

Moreover, when a wiring line formed in the bank forming step has the constriction pattern, a shape of the wiring line may be such a shape illustrated in FIGS. 12(i) through (l).

As illustrated in FIG. 12(i), a wiring line 233 includes a wiring forming region 234 and a constricted region 235, and becomes narrow at the constricted region 235. The constricted region 235 has linewidths narrower than a linewidth of the wiring forming region 234, and has three lanes extending along the longitudinal direction of the wiring forming region 234. An upper layer wiring 240 is formed in such a manner to at least overlap the constricted region 235.

When the ink is dropped in such wiring line 233, the dropped ink rises at the constricted region 235. The ink is baked in the baking step, so that a lower layer wiring 237 and a contact hole wiring 238 can be simultaneously formed. In the wiring line 233, the baked product of the ink dropped in the wiring forming region 234 is a lower layer wiring 237, and the baked product of the ink dropped in the constricted region 235 is a contact hole wiring 238. After that, through the interlayer insulating film applying step and the etching back step, an upper layer wiring 240 is formed to be connected with the contact hole wiring 238. Herewith, the multilayer wiring board is manufactured.

As illustrated in FIG. 12(m), in the manufactured multilayer wiring board, the contact hole wiring 238, which is formed at the same time as the lower layer wiring 237 is formed, is connected with the upper layer wiring 240. An interlayer insulating film 239 is provided between the lower layer wiring 237 and the upper layer wiring 240. The interlayer insulating wiring 239 is formed in the interlayer insulating film applying step. Moreover, a passivation film 241 is formed on the upper layer wiring 240. The passivation film 241 has a function to prevent moisture absorption. The passivation film 241 is formed on the upper layer wiring 240 by depositing a SiN film or the like by CVD method.

The constricted region may be in a shape illustrated in FIG. 12(j). In other words, a constricted region 235' has linewidths narrower than a linewidth of the wiring forming region 234', and, in addition to three lanes extending along the longitudinal direction of the wiring forming region 234', a lane which vertically cuts cross the three lanes. When the ink is dropped in a wiring line 234', as illustrated in FIG. 12(n), a contact hole 238', which is formed at the same time as a lower layer wiring 237' is formed, can be connected with an upper layer wiring 240'.

The constricted region may be in a shape illustrated in FIG. 12(*k*). As illustrated in the figure, a constricted region 235″ has linewidths narrower than a linewidth of a wiring forming region 234″, and two lanes in a shape of a zigzag line extending along the longitudinal direction of the wiring forming region 234″.

The constricted region may be in a shape illustrated in FIG. 12(*l*). As illustrated in the figure, a constricted region 235‴ has a linewidth narrower than a linewidth of a wiring forming region 234‴, and one lane in an S-shaped curve extending along the longitudinal direction of the wiring forming region 234‴.

When the constricted region is in the shape illustrated in FIG. 12(*k*) or (*l*), a contact hole wiring which interconnects the upper layer wiring with the lower layer wiring can be provided as illustrated in FIGS. 12(*o*) or (*p*).

FIGS. 12(*a*) through (*p*) illustrate the shape of the wiring line in the case where the upper layer wiring is arranged perpendicular to the lower layer wiring, but the shape of the wiring line is not limited to the above. For example, as illustrated in FIGS. 13(*a*) through (*h*), in even in the case where the upper layer wiring is not arranged perpendicular to the lower layer wiring, the method for forming a multilayer interconnection is also applicable. FIGS. 13(*a*) through (*h*) illustrate other example shapes of a wiring line to be formed in the bank forming step in accordance with the method for forming a multilayer interconnection. FIGS. 13(*a*) and (*b*) are plan views illustrating a wiring line having the protruding pattern. FIGS. 13(*c*) and (*d*) are cross sectional views of a multilayer wiring board taken along line A-A' of FIGS. 13(*a*) and (*b*). The multilayer wiring board is to be manufactured when the wiring line illustrated in FIGS. 13(*a*) and (*b*) is formed. FIGS. 13(*e*) and (*f*) are plan views illustrating a wiring line having the constriction pattern. FIGS. 13(*g*) and (*h*) are cross sectional views of a multilayer wiring board taken along line B-B' of FIGS. 13(*e*) and (*f*). The multilayer wiring board is to be manufactured when the wiring line illustrated in FIGS. 13(*e*) and (*f*) is formed.

As illustrated in FIG. 13(*a*), an upper layer wiring 340 is bended in an "L" shape, and a lower layer wiring 337 is arranged in such a manner to overlap a bended section of the upper layer wiring 340. When the lower layer wiring 337 and the upper layer wiring 340 are arranged in such a way, as illustrated in the figure, a protruding region 335 is formed sticking out from a wiring forming region 334 along the shape of the bended section of the upper layer wiring 340.

Besides, as illustrated in FIG. 13(*b*), when an upper layer wiring 340' is formed in a cross shape, a protruding region 335' is formed sticking out from a wiring forming region 334' along the cross shape of the upper layer wiring 340'.

When the protruding region is in the shape illustrated in FIGS. 13(*a*) and (*b*), a contact hole wiring which connects the upper layer wiring with the lower layer wiring can be formed as illustrated in FIGS. 13(*c*) and (*d*).

Furthermore, when the wiring line formed in the bank forming step has the constriction pattern, the shape of the wiring line may be such a shape illustrated in FIGS. 13(*e*) and (*f*).

As illustrated in FIG. 13(*e*), when an upper layer wiring 440 is formed bended in the "L" shape, a wiring forming region 434 is formed to avoid the bended section of the "L" shape of the upper layer wiring 440. A constricted region 435 has linewidths narrower than a linewidth of the wiring forming region 434, and is formed to be bended in a direction opposite to the bended direction of the wiring forming region 434.

Even in the case where the upper layer wiring is formed as illustrated in FIG. 13(*f*), the method for forming a multilayer interconnection is also applicable. In FIG. 13(*f*), an upper layer wiring 440' is divided into two, and the divided upper layer wiring 440' is arranged parallel to a lower layer wiring 437', overlapping part of the lower layer wiring 437'. In such a case, a wiring forming region 434' is formed separated at a divided section of the upper layer wiring 440'. A constricted region 435' has a linewidth narrower than a linewidth of the wiring forming region 434', and is formed in a "U" shape. The constricted region 435' is formed in such a manner to overlap the divided section of the upper layer wiring 440'.

Even when the constricted region is in the shape illustrated in FIGS. 13(*e*) or (*f*), a contact hole wiring which connects the upper layer wiring with the lower layer wiring can be formed.

Figure 14:
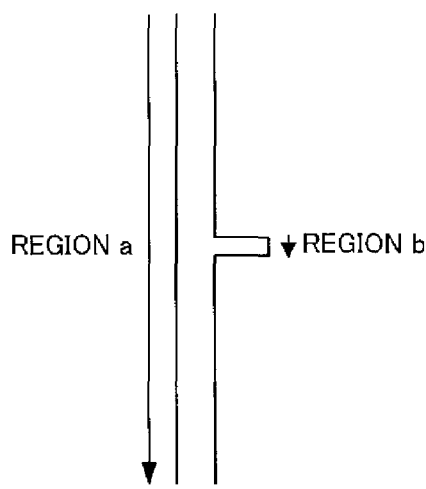
FIG. 14(a) is a view schematically illustrating an ink dropped position in a wiring line formed in a bank forming step when the wiring line has the protruding pattern.
FIG. 14(b) is a view schematically illustrating an ink dropped position in a wiring line formed in a bank forming step when the wiring line has the constriction pattern.
Figure 14:
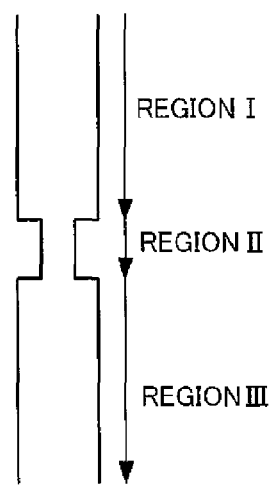

Moreover, in the wiring material applying step of the method for forming a multilayer interconnection, an ink dropping method is not especially limited. In a wiring line formed in the bank forming step, wherever an ink dropped position is arranged only at a relatively narrow linewidth region or only at a relatively wide linewidth region, the ink shows the ink behavior characteristic. The following more specifically describes the ink dropping method with reference to FIGS. 14(*a*) and (*b*). FIGS. 14(*a*) and (*b*) are views schematically illustrating a position where ink is dropped in the wiring line formed in the bank forming step. FIG. 14(*a*) illustrates a wiring line having the protruding pattern. FIG. 14(*b*) illustrates a wiring line having the constriction pattern.

As illustrated in FIG. 14(*a*), when the wiring line formed in the bank forming step has the protruding pattern, an ink dropped position may be a region a or a region b. And the ink dropping may be carried out by:

(1) dropping the ink only in the region a, and stretching the ink to the region b; or (2) dropping the ink in both regions a and b.

The ink behavior characteristic is also observed in the case where the ink is dropped in any of the methods (1) and (2).

As illustrated in FIG. 14(*b*), when the wiring line formed in the bank forming step is the constriction pattern, an ink dropped position may be regions (I), (II), or (III). And the ink dropping may be carried out by:

(3) dropping the ink in the regions (I), (II), and (III);

(4) dropping the ink only in the region (I), and stretching the ink to the regions (I) and (II);

(5) dropping the ink only in the region (II), and stretching the ink to the regions (I) and (III);

(6) dropping the ink only in the region (III), and stretching the ink to the regions (I) and (II);

(7) dropping the ink in the regions (I) and (III), and stretching the ink to the region (II).

The ink behavior characteristic is also observed in the case where the ink is dropped in any of the methods (3) through (7).

Figure 15:
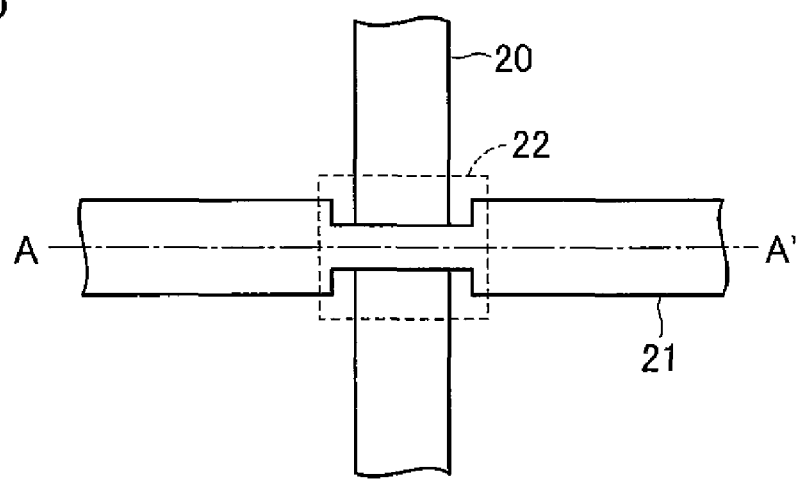
FIG. 15 is a plan view illustrating an arrangement of a gate wiring and a source wiring in a liquid crystal display device.
Figure 16:
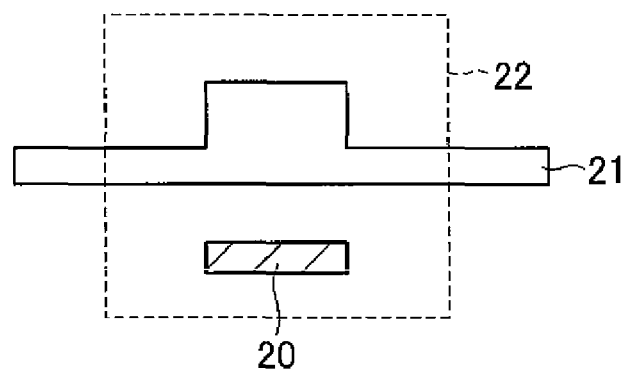
FIG. 16(a) is a cross sectional view of film thickness distributions of the gate wiring and the source wiring in the liquid crystal display device taken along line A-A' of FIG. 15. The gate wiring and the source wiring are formed by a method for forming a multilayer interconnection in accordance with another embodiment of the present invention.
FIG. 16(b) is a cross sectional view of film thickness distributions of the gate wiring and the source wiring in the liquid crystal display device taken along line A-A' of FIG. 15. The gate wiring and the source wiring are formed by a conventional technique (sputtering technique).
Figure 16:
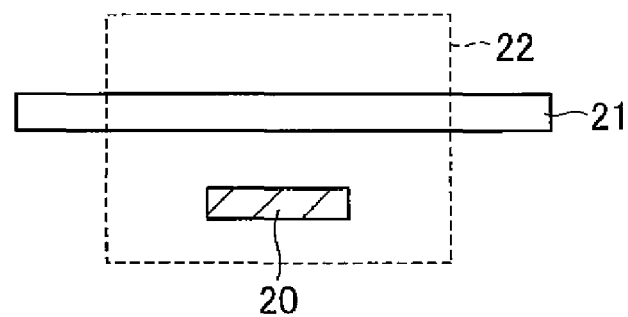

Moreover, the method for forming a multilayer interconnection is applicable to form a gate wiring and a source wiring in a liquid crystal display device. The following describes an example in which the method for forming a multilayer interconnection of this embodiment is applied to a method for forming a liquid crystal display device with reference to FIG. 15 and FIGS. 16(*a*) and (*b*). FIG. 15 is a plan view illustrating a position of a gate wiring and a source wiring in a liquid crystal display device.

A liquid crystal display device includes; display elements in which pixels are arranged in a matrix; a source driver and a gate driver as a driving circuit; a power supply circuit and the like. In each pixel, a display element and a switching element are provided. In the display elements, several gate wirings and several source wirings respectively crossing each gate wiring are provided, and each pixel is provided to each couple of the gate wiring and source wiring.

As illustrated in FIG. 15, in the liquid crystal display device, a gate wiring 20 crosses a source wiring 21. Generally, an intersection region 22 of the gate wiring 20 and the source wiring 21 is arranged in such a manner that any one of the gate wiring 20 or the source wiring 21 is constricted in order to reduce a capacity between wirings. To put it differently, any one of the gate wiring 20 or the source wiring 21 is constricted at the intersection region 22. In FIG. 15, the source wiring 21 has the constriction pattern.

When the gate wiring and the source wiring are formed by conventional technique (sputtering technique), as illustrated in FIG. 16(b), the gate wiring 20 and the source wiring 21 have a certain film thickness at the intersection region 21. This results in the rise of the value of wiring resistance at the constricted section of the source wiring 21. FIGS. 16(a) and (b) are cross sectional views taken along line A-A' of FIG. 15.

On the other hand, when the gate wiring and the source wiring are formed by the method for forming a multilayer interconnection of Embodiment 2, it is possible to moderate the rise of the value of resistance at the constricted section of the source wiring 21. In the bank forming step, a wiring guide is provided to form the source wiring 21 on a substrate, At this time, the wiring guide formed on the substrate has the constriction pattern. Accordingly, when the ink made of a wiring material is dropped in the wiring guide in the wiring material applying step, the dropped ink rises at the constricted section of the wiring guide according to the ink behavior characteristic. Then, baking treatment is performed in the baking step. Consequently, the film thickness of the formed source wiring 21, as illustrated in FIG. 16(a), becomes thick at the intersection region (constricted section) 22. The width of the constricted section of the source wiring 21 is controlled to obtain a desired film thickness of the source wiring 21 at the intersection region 22. This makes it possible to moderate the rise of the value of wiring resistance at the constricted section of the source wiring 21 without many manufacturing steps. Also, by controlling the film thickness of the constricted section of the source wiring 21, the width of the constricted section can be arranged narrower. This allows a capacity between the gate and source to be lowered.

The present invention is not limited to the description of the embodiments above, but may be altered by a skilled person within the scope of the claims. An embodiment based on a proper combination of technical means disclosed in different embodiments is encompassed in the technical scope of the present invention.

As described above, a multilayer wiring board of the present invention includes a region surrounded by an inner wall forming a contact hole, the region having a linewidth region where regions having different linewidths are connected.

Also, as described above, in a method for manufacturing a multilayer wiring board in accordance with the present invention, a contact hole is formed in such a manner that a region surrounded by an inner wall forming the contact hole has a linewidth region where regions having different linewidths are connected.

Therefore, compared with a multilayer wiring board having a conventional shaped contact hole (the shape of the contact hole illustrated in FIG. 18(a)), the baked product of the ink droplets is successfully connected with the upper layer wiring. Herewith, a highly reliable multilayer interconnection (baked product of the ink droplets) can be provided between the lower layer wiring and the upper layer wiring.

Moreover, in the multilayer wiring board of the present invention, it is preferable that a contact facilitating material to support connection with the upper layer be formed inside the contact hole.

When the contact hole is formed in such a manner that the aspect ratio is larger, the dropped ink droplets may not rise to the upper layer wiring. With the above configuration, a contact facilitating material to support connection with the upper layer wiring is formed inside the contact hole. Thereby, when the contact hole is formed in such a manner that the aspect ratio is larger, the dropped ink droplets rise to the upper layer wiring, so that the baked product of the ink droplets comes into contact with the upper layer wiring.

Therefore, with the above configuration, when the contact hole is formed in such a manner that the aspect ration is larger, a highly reliable multilayer interconnection can be formed between the lower layer wiring and the upper layer wiring.

As described above, the multilayer wiring board of the present invention is formed in such a manner that while the lower layer wiring is formed by dropping the ink droplets including a wiring material, a wiring pattern of the lower layer wiring is formed of a linewidth region where regions having different linewidths are connected, and a relatively narrow linewidth among the regions having different linewidths is arranged at that region of the lower layer wiring which is overlapped by the upper layer wiring.

Furthermore, the method for manufacturing a multilayer wiring board, as described above, includes: forming a bank on a substrate in such a manner that a region surrounded by the banks is to be a linewidth region where regions having different linewidths are connected (bank forming step); forming a lower layer wiring by dropping ink droplets including a wiring material in the region surrounded by the banks (wiring forming step); and forming an upper layer wiring above the lower layer wiring in such a manner to overlap a relatively narrow region among the regions having different linewidths.

Therefore, the baked product of the ink droplets, which rises at the relatively narrow linewidth region according to the ink behavior characteristic, comes into contact with the upper layer wiring. This makes it possible to attain a multilayer wiring board, in which a lower layer wiring and an interconnection section to be electrically conducted with the lower layer wiring can be formed at the same time. This allows the processing steps to be shortened and a highly reliable multilayer interconnection to be provided.

In the multilayer wiring board of the present invention, the linewidth region may have the protruding pattern in which the relatively narrow linewidth region among the regions having different linewidths sticks out.

Also, in the multilayer wiring board of the present invention, the linewidth region may have the constriction pattern in which the relatively narrow linewidth region among the regions having different linewidths is constricted.

Furthermore, it is preferable that the method for manufacturing a multilayer wiring board in accordance with the present invention include an interlayer insulating film applying step, in which after the wiring forming step, an interlayer insulating film is applied to the substrate on which the lower layer wiring board is formed.

With this configuration, the lower layer wiring and the interconnection section to be connected with the lower layer wiring are formed at first in the wiring forming step, and then, an interlayer insulating film is formed in the interlayer insulating film applying step. Herewith, an interlayer insulating film with fine step coverage can be provided. In other words, in the interlayer insulating film applying step, the interlayer insulating film is widely applied to regions out of the interconnection section, so that the effect of the foundations such as a shape of the cross section of the contact hole (becoming inverse tapered shape, large aspect ratio) becomes small. As a result, compared with the conventional method for manufacturing a multilayer wiring board, an interlayer insulating film with fine step coverage can be provided.

Moreover, it is preferable that the method for manufacturing a multilayer wiring board include a hydrophilic and hydrophobic treatment step, in which after the bank forming step, while a hydrophilic treatment is performed on regions of the substrate, where the bank is not formed, a hydrophobic treatment is performed on the surface of the bank.

Herewith, when the ink droplets including a wiring material are dropped in the wiring forming step, if the ink droplets are dropped not in the proper position, but on the bank, the ink droplets are drawn into a region surrounded by the banks. Thus, with the above configuration, in the wiring forming step, the ink droplets including a wiring material can be more effectively dropped in the region surrounded by the banks.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

Industrial Applicability

In the present invention, as described above, a highly reliable interconnection can be provided between a lower layer wiring and an upper layer wiring. Therefore, the present invention is applicable to a wiring forming technique with an inkjet device, a color filter forming technique, or a picture electrode forming technique.

The invention claimed is:

1. A multilayer wiring board comprising:
   a lower layer wiring; and
   an upper layer wiring formed above the lower layer wiring with an interlayer insulating layer provided therebetween,
   the interlayer insulating layer having a contact hole to connect the upper layer wiring with the lower layer wiring,
   the contact hole having an inner wall surrounding a region having a linewidth region where regions having different linewidths are connected, and
   a film thickness of a baked product of ink droplets is thicker at a relatively narrow linewidth region than at a relatively wide linewidth region.

2. The multilayer wiring board as set forth in claim 1, comprising:
   a contact facilitating material inside the contact hole, the contact facilitating material facilitating connection to the upper layer wiring.

3. A multilayer wiring board comprising:
   a lower layer wiring; and
   an upper layer wiring formed above the lower layer wiring, the lower layer wiring being formed by dropping ink droplets including a wiring material, and having a wiring pattern having a linewidth region where regions having different linewidths are connected,
   a relatively narrow linewidth region among the regions having different linewidths being arranged at that region of the lower layer wiring which is overlapped by the upper layer wiring, and
   a film thickness of a baked product of ink droplets is thicker at a relatively narrow linewidth region than at a relatively wide linewidth region.

4. The multilayer wiring board as set forth in any one of claim 1 or 3, wherein the linewidth region has a protruding pattern in which a relatively narrow linewidth region among regions having different linewidths sticks out.

5. The multilayer wiring board as set forth in claim 1 or 3, wherein the linewidth region has a constriction pattern which is constricted at a relatively narrow linewidth region among regions having different linewidths.

6. A method for manufacturing a multilayer wiring board, comprising:
   forming a contact hole, in an interlayer insulating layer, for connecting an upper layer wiring and an lower layer wiring; and
   forming an interconnection section by dropping, in the contact hole, ink droplets including a wiring material, the interconnection section electrically connecting the upper layer wiring with the lower layer wiring,
   wherein in the step of forming the contact hole, the contact hole is formed in such a manner that a region surrounded by an inner wall forming the contact hole has a linewidth region where regions having different linewidths are connected, and a film thickness of a baked product of ink droplets is thicker at a relatively narrow linewidth region than at a relatively wide linewidth region.

7. A method for manufacturing a multilayer wiring board, comprising:
   forming a bank on a substrate in such a manner that a region surrounded by the bank is a linewidth region where regions having different linewidths are connected;
   forming a lower layer wiring by dropping ink droplets in the region surrounded by the bank, the ink droplets including a wiring material; and
   forming an upper layer wiring above the lower layer wiring in such a manner to overlap a relatively narrow linewidth region among the regions having different linewidths,
   wherein a film thickness of a baked product of ink droplets is thicker at a relatively narrow linewidth region than at a relatively wide linewidth region.

8. The method as set forth in claim 7, further comprising, after the step of forming the lower layer wiring:
   applying an interlayer insulating film, to the substrate on which the lower layer wiring is formed.

9. The method for manufacturing a multilayer wiring board as set forth in claim 7, further comprising, after the bank forming step:
   performing a hydrophilic and hydrophobic treatment, in which a hydrophilic treatment is performed on a region of the substrate where the bank is not formed, a hydrophobic treatment is performed on the surface of the bank.

* * * * *